(12) United States Patent
Cheng et al.

(10) Patent No.: US 12,254,794 B2
(45) Date of Patent: Mar. 18, 2025

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yudiao Cheng, Beijing (CN); Weiyun Huang, Beijing (CN); Yuanyou Qiu, Beijing (CN); Jianchang Cai, Beijing (CN); Lili Du, Beijing (CN); Chi Yu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,417

(22) PCT Filed: Jul. 21, 2021

(86) PCT No.: PCT/CN2021/107682
§ 371 (c)(1),
(2) Date: Jun. 1, 2022

(87) PCT Pub. No.: WO2023/000219
PCT Pub. Date: Jan. 26, 2023

(65) Prior Publication Data
US 2024/0078936 A1   Mar. 7, 2024

(51) Int. Cl.
*G09F 9/302* (2006.01)
*H10K 59/131* (2023.01)
*H10K 59/122* (2023.01)

(52) U.S. Cl.
CPC ......... *G09F 9/3023* (2013.01); *H10K 59/131* (2023.02); *H10K 59/122* (2023.02)

(58) Field of Classification Search
CPC ... G09F 9/3023; H10K 59/131; H10K 59/122
USPC .......................................................... 257/40
See application file for complete search history.

(56) References Cited

U.S. PATENT DOCUMENTS

2016/0266691 A1* 9/2016 Jang ..................... G06F 3/0446
2019/0273125 A1* 9/2019 Takechi ........... H10K 59/80518

FOREIGN PATENT DOCUMENTS

CN           110874990 A  *  3/2020  ............. G09F 9/302

* cited by examiner

*Primary Examiner* — Jami Valentine Miller
(74) *Attorney, Agent, or Firm* — Collard & Roe, P.C.; William Collard

(57) ABSTRACT

A display panel and a display device are provided. In the display panel, a first display region includes first light-emitting units, and a second display region includes second light-emitting units, first pixel circuits and second pixel circuits, the first pixel circuit is connected with the first light-emitting unit, and the second pixel circuit is connected with the second light-emitting unit. The first display region includes a first region and a second region on a side of the first region away from the second display region, the second display region includes a third region and a fourth region on a side of the third region close to the first display region, the first light-emitting unit in the first region is connected with the first pixel circuit in the third region, the first light-emitting unit in the second region is connected with the first pixel circuit in the fourth region.

19 Claims, 16 Drawing Sheets

| R | G1 | R | G1 | R | G1 | | R | G1 | R | G1 | | | |
|---|----|---|----|---|----|---|---|----|---|----|---|----|----|
| B | G2 | B | G2 | B | G2 | 20 | B | G2 | B | G2 | 20 | 40 | 40 |
| R | G1 | R | G1 | R | G1 | | R | G1 | R | G1 | | 40 | 40 |
| B | G2 | B | G2 | B | G2 | 20 | B | G2 | B | G2 | 20 | | |
| R | G1 | R | G1 | R | G1 | | R | G1 | R | G1 | | 40 | 40 |
| B | G2 | B | G2 | B | G2 | 20 | B | G2 | B | G2 | 20 | | |
| R | G1 | R | G1 | R | G1 | | R | G1 | R | G1 | | 40 | 40 |
| B | G2 | B | G2 | B | G2 | 20 | B | G2 | B | G2 | 20 | | |
| R | G1 | R | G1 | R | G1 | | R | G1 | R | G1 | | 40 | 40 |
| B | G2 | B | G2 | B | G2 | 20 | B | G2 | B | G2 | 20 | | |
| R | G1 | R | G1 | R | G1 | | R | G1 | R | G1 | | 40 | 40 |
| B | G2 | B | G2 | B | G2 | 20 | B | G2 | B | G2 | 20 | | |
| R | G1 | R | G1 | R | G1 | | R | G1 | R | G1 | | 40 | 40 |
| B | G2 | B | G2 | B | G2 | 20 | B | G2 | B | G2 | 20 | | |

DISPLAY PANEL AND DISPLAY DEVICE

CROSS REFERENCE TO RELATED APPLICATIONS

This application is the National Stage of PCT/CN2021/107682 filed on Jul. 21, 2021, the disclosure of which is incorporated by reference.

TECHNICAL FIELD

At least one embodiment of the present disclosure relates to a display panel and a display device.

BACKGROUND

At present, people's requirements for visual effects of display products are gradually increasing, and display products with high screen ratio, such as narrow frame or even full screen display, have become the development trend of organic light-emitting diode (OLED) display products. An under-screen camera is the key to design a full screen. It doesn't need to punch holes in the screen to place the camera. Therefore, the design of under-screen camera can play a leading role in the appearance and screen ratio of mobile phones.

SUMMARY

At least one embodiment of the present disclosure provides a display panel and a display device.

At least one embodiment of the present disclosure provides a display panel including a base substrate. The display panel includes a first display region and a second display region, the second display region is on at least one side of the first display region in a first direction, the first display region includes a plurality of first light-emitting units on the base substrate, and the second display region includes a plurality of second light-emitting units, a plurality of first pixel circuits and a plurality of second pixel circuits on the base substrate, in the first direction, at least one of the plurality of first pixel circuits is between adjacent second pixel circuits, at least one of the plurality of first pixel circuits is connected with at least one of the plurality of first light-emitting units, and at least one of the plurality of second pixel circuits is connected with at least one of the plurality of second light-emitting units. The display panel further includes a plurality of traces on the base substrate and configured to connect the first pixel circuits and corresponding first light-emitting units. The first display region includes a plurality of regions arranged along the first direction, the plurality of regions include a first region and a second region, the second display region includes a third region and a fourth region arranged along the first direction, the first light-emitting unit in the first region is connected with the first pixel circuit in the third region, the first light-emitting unit in the second region is connected with the first pixel circuit in the fourth region, the fourth region is on a side of the third region close to the first display region, and the first region is on a side of the second region close to the second display region.

For example, each of traces connected with some of first light-emitting units in one region, which is farthest from the second display region, among the plurality of regions in the first display region includes a main portion and an edge portion which extend in the first direction, the main portion and the edge portion are on different straight lines, a length of the main portion is larger than a length of the edge portion, and the main portion passes through the second display region.

For example, the plurality of traces include a plurality layers of traces distributed in different layers, and the plurality layers of traces sequentially include a first trace layer, a second trace layer and a third trace layer in a direction perpendicular to the base substrate, and the first trace layer is between the second trace layer and the base substrate; the plurality of regions further include a fifth region and a sixth region, the fifth region is on a side of the first region close to the second display region, and the sixth region is between the first region and the second region, and the first light-emitting unit of the fifth region is connected with the first trace layer, the first light-emitting unit of the first region is connected with the second trace layer, and the first light-emitting unit of the sixth region is connected with the third trace layer, the first light-emitting unit of the second region is connected with at least one of the first trace layer, the second trace layer and the third trace layer, and the second region is one region farthest from the second display region among the plurality of regions.

For example, a ratio of a length of a longest trace in the second trace layer connected with the first light-emitting unit in the first region to a length of a longest trace in traces connected with the first light-emitting unit in the second region ranges from 0.8 to 1.2.

For example, the display panel further includes: a transfer line, on a side of the first trace layer facing the base substrate. The traces connected with some of the first light-emitting units in the second region are connected with corresponding first pixel circuits through the transfer line.

For example, the first light-emitting units in the first region are connected with the first pixel circuits in the third region through a plurality of first traces in the second trace layer, and some of the first light-emitting units in the second region are connected with corresponding first pixel circuits in the fourth region through a plurality of second traces in the second trace layer; the first region includes a first central region extending in the first direction and first edge regions on both sides of the first central region in the second direction, the first traces are in the first edge region, the second traces are in the first central region, and the second direction intersects with the first direction.

For example, the second display region further includes a seventh region, the first light-emitting units in the fifth region are connected with the first pixel circuits in the seventh region through a plurality of third traces in the first trace layer, and the seventh region is on a side of the fourth region facing the first display region.

For example, some of the first light-emitting units in the second region are connected with corresponding first pixel circuits in the fourth region through a plurality of fourth traces in the first trace layer; the plurality of fourth traces in the first trace layer include a plurality of first sub-traces and a plurality of second sub-traces, a portion, of each of the plurality of first sub-traces, extending in the first direction passes through the seventh region to connect with the first pixel circuit in the fourth region, and the plurality of second sub-traces bypass the seventh region to connect with the first pixel circuits in the fourth region.

For example, an eighth region is between the fourth region and the seventh region, and the plurality of second sub-traces bypass an edge of the seventh region and pass through the eighth region to connect with the first pixel circuits in the fourth region.

For example, first light-emitting units belong to a first part of the first light-emitting units in the sixth region are connected with corresponding first pixel circuits in the eighth region through a plurality of fifth traces in the third trace layer, and some of the first light-emitting units in the second region are connected with corresponding first pixel circuits in the fourth region through a plurality of sixth traces in the third trace layer.

For example, the second display region further includes a ninth region on a side of the seventh region facing the first display region, and first light-emitting units belong to a second part of the first light-emitting units of the sixth region are connected with corresponding first pixel circuits in the ninth region through the plurality of fifth traces in the third trace layer.

For example, the second display region further includes a tenth region between the fourth region and the third region, and first light-emitting units belong to a third part of the first light-emitting units of the sixth region are connected with corresponding first pixel circuits in the tenth region through the plurality of fifth traces in the third trace layer.

For example, the ninth region includes a second central region extending in the first direction and second edge regions on both sides of the second central region in the second direction, the plurality of fifth traces are in the second edge region, the plurality of sixth traces are in the second central region, and the second direction intersects with the first direction.

For example, the plurality of traces include a transparent trace.

For example, the plurality of second pixel circuits include a plurality of columns of second pixel circuits extending along a second direction intersecting the first direction and arranged along the first direction, and the plurality of first pixel circuits include a plurality of columns of first pixel circuits extending along the second direction and arranged along the first direction; and at least one column of first pixel circuits is between two adjacent columns of second pixel circuits.

For example, an amount of columns of first pixel circuits configured to be connected with first light-emitting units provided in at least one selected from the group consisting of the third region, the fourth region, the seventh region, the eighth region, the ninth region and the tenth region is no more than 18 columns.

For example, the first display region includes a first central axis extending in the first direction and a second central axis perpendicular to the first central axis, and traces connected with first light-emitting units in at least one selected from the group consisting of the first region, the fifth region and the sixth region are distributed symmetrically with the first central axis as a central axis and are distributed symmetrically with the second central axis as a central axis.

For example, the plurality of traces are symmetrically distributed with the first central axis as a central axis, and the plurality of traces are symmetrically distributed with the second central axis as a central axis.

At least one embodiment of the present disclosure provides a display device, including the display panel as mentioned above.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1:
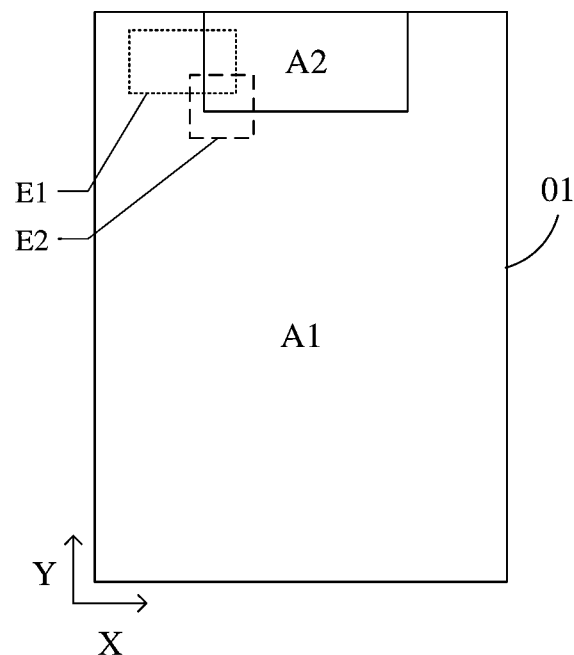
FIG. 1 is a schematic plan structure of a display panel.

FIG. 1 is a schematic plan structure of a display panel. As shown in FIG. 1, the display panel includes a base substrate 01. The display panel includes a first display region A1 and a second display region A2, and the first display region A1 may at least partially surround the second display region A2. For example, the second display region A2 as shown in FIG. 1 is located in a middle of a top of the base substrate 01, and four sides of the first display region A1 having a rectangular shape may all surround the second display region A2, that is, the second display region A2 may be completely surrounded by the first display region A1.

For example, the second display region A2 may not be located in the middle of the top of the base substrate 01 as shown in FIG. 1, but may be located in other positions. For example, the second display region A2 may be located at an upper left corner or an upper right corner of the base substrate 01.

Figure 2:
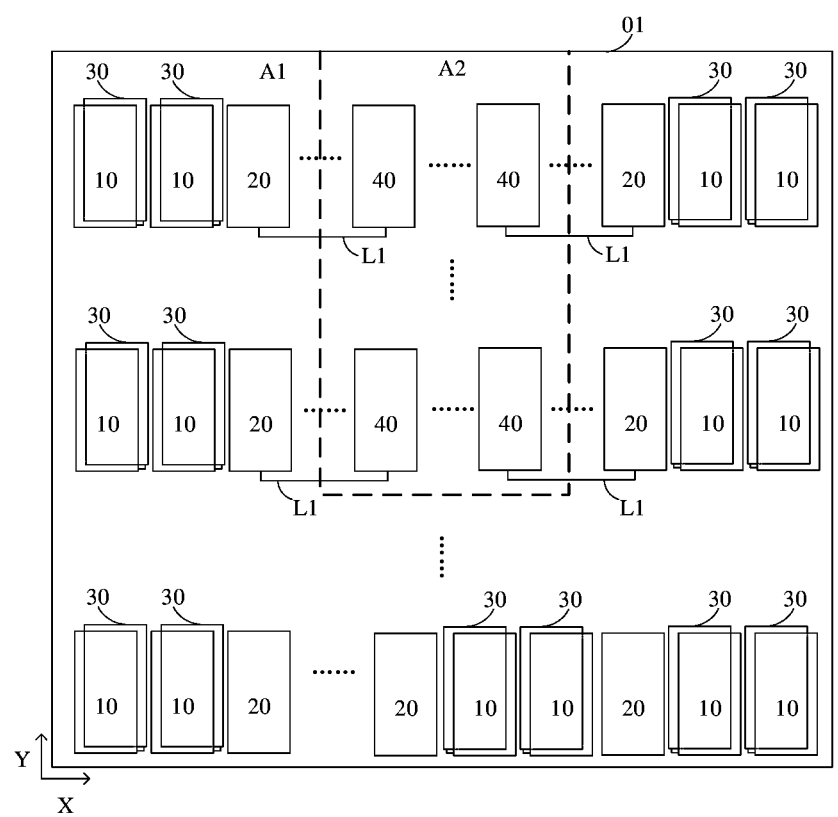
FIG. 2 is an enlarged view of a partial detail of the display panel as shown in FIG. 1.

FIG. 2 is an enlarged view of a partial detail of the display panel as shown in FIG. 1. As shown in FIGS. 1 and 2, the display panel includes a plurality of first pixel circuits 10, a plurality of second pixel circuits 20 and a plurality of first light-emitting elements 30 located in the first display region A1, and a plurality of second light-emitting elements 40 located in the second display region A2, and at least one column of first pixel circuits 10 can be arranged between two adjacent columns of second pixel circuits 20.

For example, as shown in FIGS. 1 and 2, at least one first pixel circuit 10 may be connected with at least one first light-emitting element 30, and an orthographic projection of the first pixel circuit 10 on the base substrate 01 and an orthographic projection of the at least one first light-emitting element 30 connected with the first pixel circuit on the base substrate 01 may at least partially overlap. The first pixel circuit 10 can be used to provide a driving signal for the first light-emitting element 30 connected with the first pixel circuit to drive the first light-emitting element 30 to emit light.

For example, as shown in FIGS. 1 and 2, at least one second pixel circuit 20 may be connected with at least one second light-emitting element 40 through a conductive line L1, and the second pixel circuit 20 may be used to provide a driving signal for the second light-emitting element 40 connected with the second pixel circuit to drive the second light-emitting element 40 to emit light. The second light-emitting element 40 and the second pixel circuit 20 are located in different regions, there is no overlap between an orthographic projection of at least one second pixel circuit 20 on the base substrate 01 and an orthographic projection of at least one second light-emitting element 40 on the base substrate 01.

For example, the first display region A1 can be a non-transparent display region, and the second display region A2 can be a transparent display region. Therefore, the display panel can directly set the required hardware structures, such as photosensitive sensors, etc., in the second display region A2 without digging holes, thus providing a foundation for realizing a full screen. Because the second display region A2 only includes the light-emitting element, but does not include the pixel circuit, the light transmittance of the second display region A2 can also be improved.

Figures 3, 4:
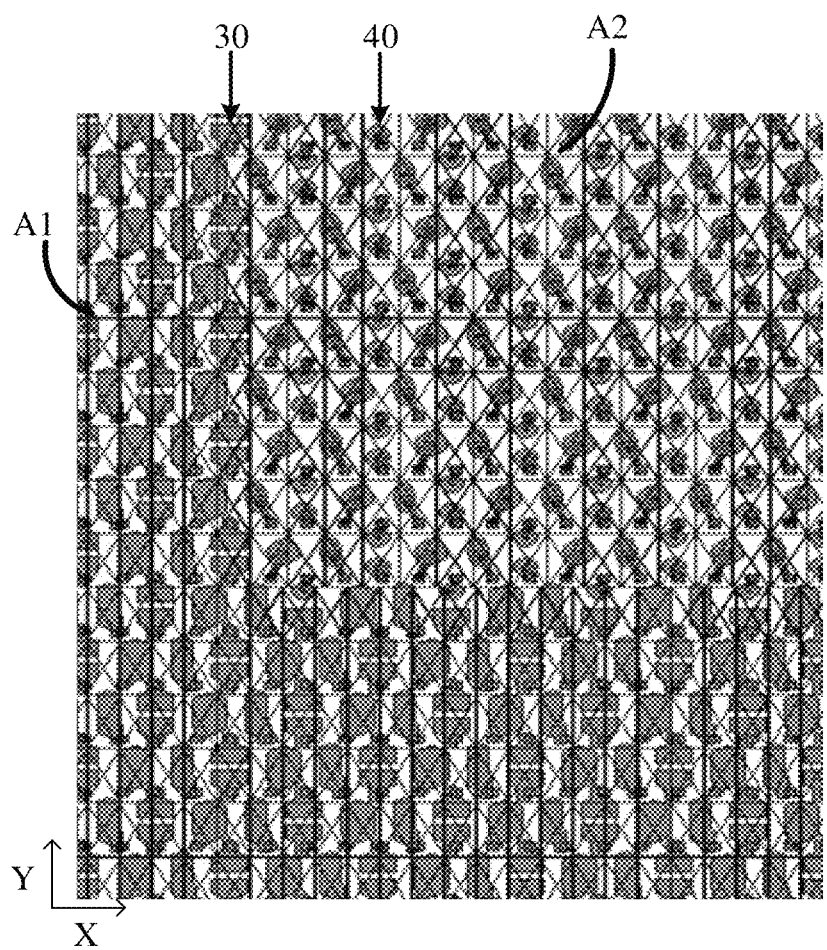
FIG. 3 is an enlarged view of a region E1 in the display panel as shown in FIG. 1.
FIG. 4 is an enlarged view of a region E2 of the display panel as shown in FIG. 1.

FIG. 3 is an enlarged view of a region E1 in the display panel as shown in FIG. 1. As shown in FIG. 3, the first display region A1 includes not only the plurality of pixels, but also the plurality of columns of second pixel circuits 20, and the second display region A2 includes only the plurality of second light-emitting elements 40.

The above-mentioned pixel refers to a structure including a pixel circuit and a light-emitting element. Taking the first pixel circuit 10 and the first light-emitting element 30 as examples, it can be seen with reference to FIG. 3 that each pixel as shown in FIG. 3 includes a red sub-pixel R, two green sub-pixels G1 and G2, and a blue sub-pixel B, and the red sub-pixel R and the blue sub-pixel B are located in the same column, and the two green sub-pixels G1 and G2 are located in the same column. Of course, in some embodiments, the pixels may also include sub-pixels with other colors and sub-pixels with other numbers, and the arrangement of each sub-pixel is not limited to the structure as shown in FIG. 3. For example, each pixel may only include one red sub-pixel R, one blue sub-pixel B, and one green sub-pixel G.

For example, the electrical connection relationship between the plurality of first pixel circuits 10 and the plurality of first light-emitting elements 30 can be in one-to-one correspondence. That is, each first pixel circuit 10 may be connected with one first light-emitting element 30, and the first light-emitting elements 30 connected with respective first pixel circuits 10 are different. Therefore, the orthographic projection of each first pixel circuit 10 on the base substrate 01 and the orthographic projection of the connected first light-emitting element 30 on the base substrate 01 are at least partially overlapped. Of course, the embodiment of the present disclosure is not limited thereto, and some of the first pixel circuits may be divided into a plurality of first pixel circuit pairs, and one first pixel circuit pair is electrically connected with one first light-emitting element.

For example, similar to the electrical connection relationship between the first pixel circuit 10 and the first light-emitting element 30, the electrical connection relationship between the second pixel circuits 20 and the second light-emitting elements 40 can also be in one-to-one correspondence. For example, the orthographic projection of each second pixel circuit 20 on the base substrate 01 does not overlap with the orthographic projection of the second light-emitting element 40 connected with the second pixel circuit 20 on the base substrate 01.

For example, a density of the second light-emitting elements 40 located in the second display region A2 may be the same as a density of the first light-emitting elements 30 located in the first display region A1. For example, in two regions, with the same area, respectively in the first display region A1 and the second display region A2, an amount of the light-emitting elements is the same, for example, an amount of light-emitting elements per inch in the first display region A1 and an amount of light-emitting elements per inch in the second display region A2 are the same. Therefore, the first display region A1 (including a main display region, for example) does not have two partitions with different pixels per inch, and there is no bright-dark boundary in the first display region A1 when displaying a picture, so that the display effect of the display panel is good.

For example, FIG. 4 is an enlarged view of a region E2 of the display panel as shown in FIG. 1. As shown in FIGS. 1 to 4, a resolution of the first display region A1 may be larger than that of the second display region A2. For example, an area of the first display region A1 is larger than that of the second display region A2, and an amount of the light-emitting elements included in the first display region A1 is larger than that included in the second display region A2.

For example, the resolution of the first display region A1 may be less than or equal to the resolution of the second display region A2. For example, the area of the first display region A1 and the area of the second display region A2 may be the same, and the amount of light-emitting elements in the first display region A1 and the amount of light-emitting elements in the second display region A2 may be the same. For example, the area of the first display region A1 may be smaller than that of the second display region A2, and the amount of the light-emitting elements in the first display region A1 is smaller than the amount of the light-emitting elements in the second display region A2.

For example, each light-emitting element may include a first electrode, a light-emitting layer, and a second electrode which are stacked, and the second electrode is located on a side of the light-emitting layer facing the base substrate. For example, the second electrode may be an anode of the light-emitting element. For example, as shown in FIG. 4, a size of an anode of the first light-emitting element 30 may be larger than that of an anode of the second light-emitting element 40 to ensure that the light transmittance of the second display region A2 is larger than that of the first display region A1. For example, the shape and size of the anode of the second light-emitting element 40 can be further optimized to ensure better light transmittance. For example, as shown in FIG. 4, a light-emitting region of the second light-emitting element 40 may have a shape of elliptical.

For example, in order to improve the light transmittance of the second display region A2, the conductive line L1 connecting the second light-emitting element and the second pixel circuit may be a transparent conductive line. For example, the conductive line L1 can be made of a transparent material, such as indium tin oxide (ITO), indium gallium zinc oxide (IGZO) or indium zinc oxide (IZO), etc. For example, in the case where the conductive line L1 is made of ITO material, the conductive line L1 can also be called ITO trace. The following embodiments all take the case that the conductive line L1 is an ITO trace as an example.

In a display panel, the pixel circuit (including the first pixel circuit 10 and the second pixel circuit 20) and the first light-emitting element 30 have the same pitch. For example, a width of the pixel circuit ranges from about 30 microns (μm) to 32 μm, and a length of the pixel circuit ranges from about 60 μm to 65 μm. For example, the size of one pixel circuit may be 31.6 μm*63.2 μm. In the present disclosure, on the premise of not reducing the amount of pixels in the first display region A1, to provide sufficient space for the second pixel circuit 20, each pixel circuit can be compressed along the first direction X (for example, the extending direction of a gate line, which can also be referred to as a lateral direction), so that the width of the pixel circuit in the first direction is smaller than that of the first light-emitting element 30; or, the width of the first light-emitting element 30 in the first direction may be larger than that of the first light-emitting element 30 by extending the first light-emitting element 30 in the first direction. Therefore, on the premise of the same size of the base substrate 01, by compressing the size of the pixel circuit in the first direction, more regions can be found in the first display region A1, and correspondingly, the second pixel circuit 20 dedicated to driving the second light-emitting element 40 located in the second display region A2 can be provided in the extra regions.

For example, the width of the compressed pixel circuit and the width of the first light-emitting element 30 may differ by about 4 μm. For example, the size of the compressed pixel circuit may be 27.6 μm×63.2 μm.

For example, taking the case that the shape of the second display region is a circle, and taking half of the diameter of the second display region (for example, a left half of the second display region) extending along the Y direction as an example, for the second display region with a radius of 1390.4 μm, before compression, there are 44 (which is obtained by 1390.4/31.6) columns of light-emitting elements in this radius range, that is, extra 44 columns of pixel circuits are needed to control the second light-emitting elements of the second display region. Then, the total number of pixel circuits to be compressed in the X direction is 347.6 (which is obtained by 1390.4/4) columns Because the amount of pixel circuits is an integer, at least 348 columns of original pixel circuits need to be compressed here; after compression, some of the pixel circuits (i.e. the first pixel circuits) are used to control the first light-emitting elements in the first display region, and the surplus pixel circuits (i.e. the second pixel circuits) are used to control the second light-emitting elements in the second display region.

Figure 5:
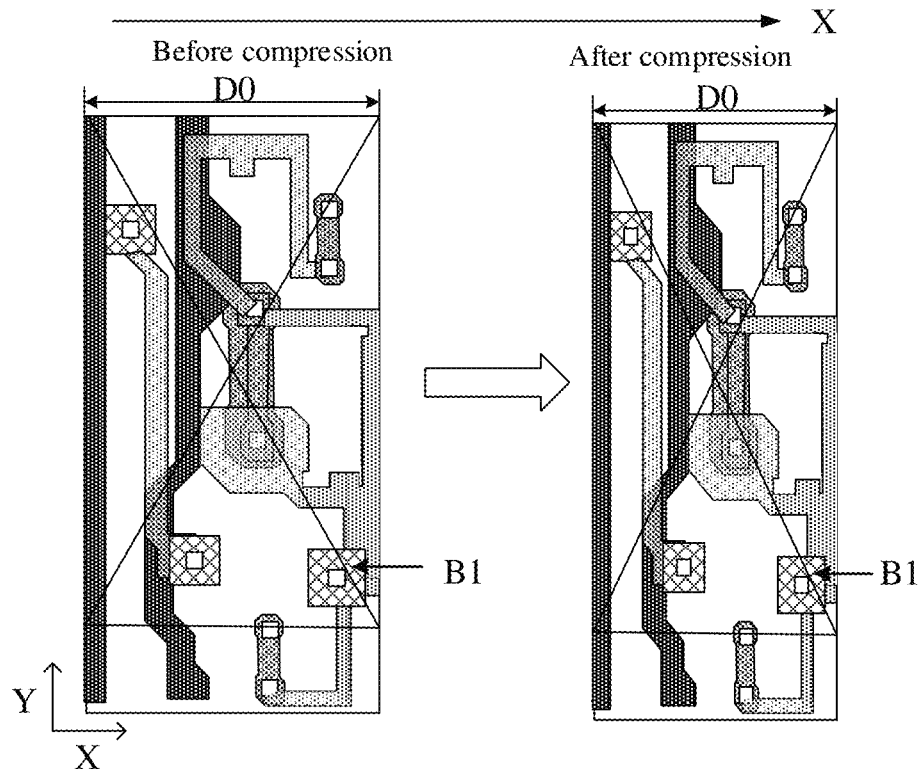
FIG. 5 shows a comparison diagram of structure layouts of pixel circuits before and after compression.

FIG. 5 shows a comparison diagram of structure layouts of pixel circuits before and after compression. For example, as shown in FIG. 5, taking the difference of the widths of the pixel circuit before and after compression as an example, the pixel circuit may include a driving structure and a transfer portion B1 for connecting to the anode of the light-emitting element, and the size of the transfer portion B1 may represent the size of the pixel circuit. Before compression, the sizes of the pixel circuit and the light-emitting element both have a width of 1-100 μm and a height of 2-200 μm. After compression, the size of the light-emitting element and the height of the pixel circuit are unchanged, but the width of the pixel circuit is narrowed by 1-20 μm, so that there will be at least one column of compressed pixel circuits which is added in every few columns of compressed pixel circuits. The whole screen adopts this design to realize full-screen compression. For example, the added columns of compression circuit can be configured to connect the second light-emitting elements 40 in the second display region A2 to control the second light-emitting elements 40 to emit light. For example, the added columns of compression circuit close to the periphery of the second display region A2 can be used as the second pixel circuit 20 to be connected with the second light-emitting element 40. The design of the above-mentioned compressed pixel circuit can realize normal display without changing the resolution of the display panel, thus enabling full use of the existing space of the display panel to realize normal display.

Figure 6:
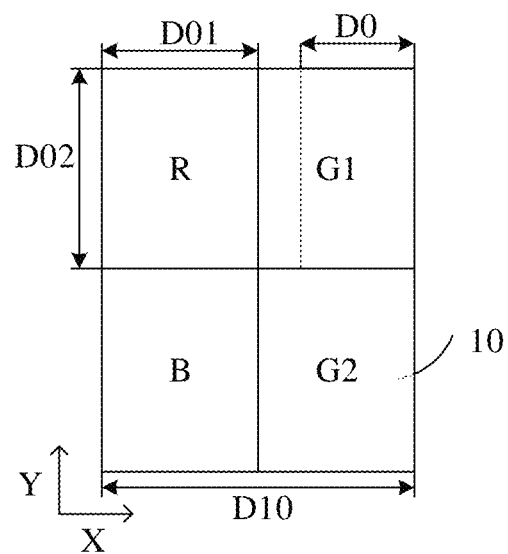
FIG. 6 is a schematic diagram of one pixel.

FIG. 6 is a schematic diagram of one pixel. As shown in FIGS. 1 to 6, the width of the pixel circuit may refer to the width of the orthographic projection of the layout of the pixel circuit on the base substrate 01 along the first direction X. The width of the first light-emitting element 30 refers to the width of the orthographic projection of the anode of the first light-emitting element 30 on the base substrate 01 along the first direction X.

For example, each first light-emitting element is included in one sub-pixel in one pixel. For example, each first light-emitting element may be a light-emitting element in a red sub-pixel R, a green sub-pixel G1 or G2, or a blue sub-pixel B. As shown in FIG. 6, upon determining the size of the anode of the first light-emitting element, the width D10 of the pixel in the first direction X can be measured in a period of one pixel, and then for the width D01 of each first light-emitting element, the total width D10 of the pixel can be divided by the amount of sub-pixels included in the pixel. Similarly, because each first light-emitting element is correspondingly connected with one pixel circuit, the width of the pixel circuit in the first direction X can still be measured by taking the pixel circuit connected with one pixel as a period, and then for the width DO of each pixel circuit, the total width can be divided by the amount of sub-pixels included in the pixel. The figure schematically shows that the X direction is the first direction, but it is not limited thereto. The Y direction can also be called the first direction, and the X direction and the Y direction can be interchanged.

Figure 7:
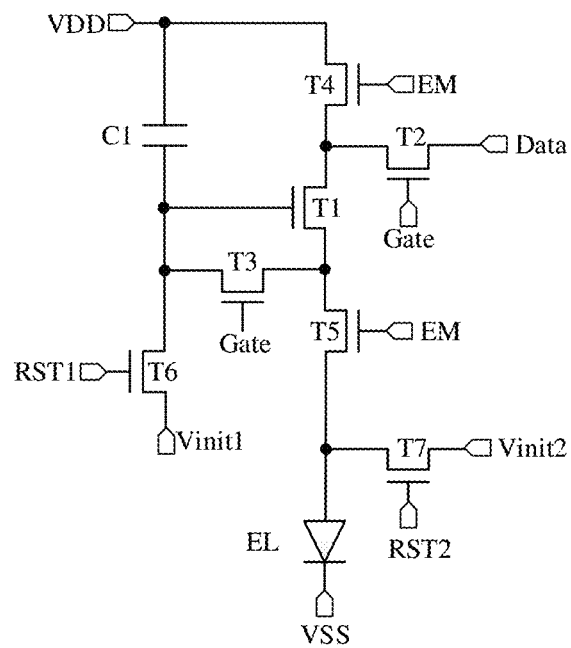
FIG. 7 is a schematic diagram of a 7T1C pixel circuit.
Figure 8:
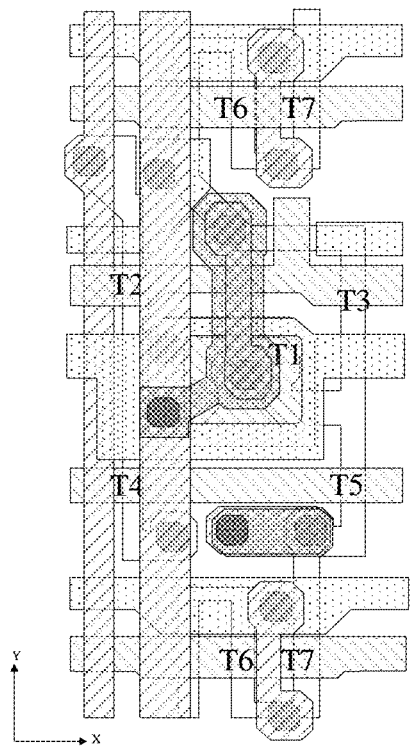
FIG. 8 is a structure layout of 7T1C pixel circuit.

For example, as shown in FIG. 5, the pixel circuit can have a 7T1C structure, that is, it includes seven transistors and one capacitor. FIG. 7 shows a schematic structure diagram of 7T1C pixel circuit, and FIG. 8 shows a structural layout of 7T1C pixel circuit. The pixel circuits shown in FIGS. 5 to 8 are the first pixel circuit, and the second pixel circuit can have the 7T1C structure shown in FIG. 5, and the layout of the second pixel circuit can be the same as or different from that as shown in FIG. 8.

For example, as shown in FIGS. 1 to 8, the 7T1C pixel circuit 10 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The pixel circuit can be connected with a gate signal terminal Gate, a data signal terminal Data, a reset signal terminals RST1 and RST2, a light-emitting control signal terminal EM, a power supply terminal VDD, an initial power supply terminals Vinit1 and Vinit2, and a light-emitting element EL, which can also be connected with a power supply terminal VSS. The pixel circuit can be used to drive the connected light-emitting element to emit light in response to the signals provided by the connected signal terminals.

For example, the gate signal terminal Gate may be a gate line, the data signal terminal Data may be a data line, the reset signal terminals RST1 and RST2 may be reset control signal lines, the light-emitting control signal terminal EM may be a light-emitting control signal line, the power supply terminal VDD may be a power supply signal line, and the initial power supply terminals Vinit1 and Vinit2 may be reset power supply signal lines.

For example, transistors can be divided into N-type transistors and P-type transistors according to their characteristics. The present disclosure is explained by taking the case that transistors are all P-type transistors as an example.

Figure 9:
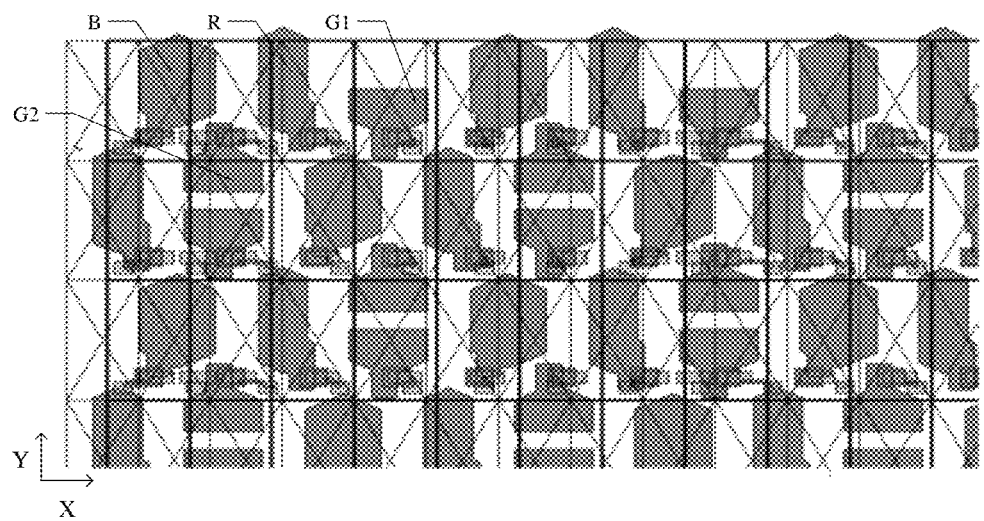
FIG. 9 is a partial structural diagram of a first display region A1.
Figure 10:
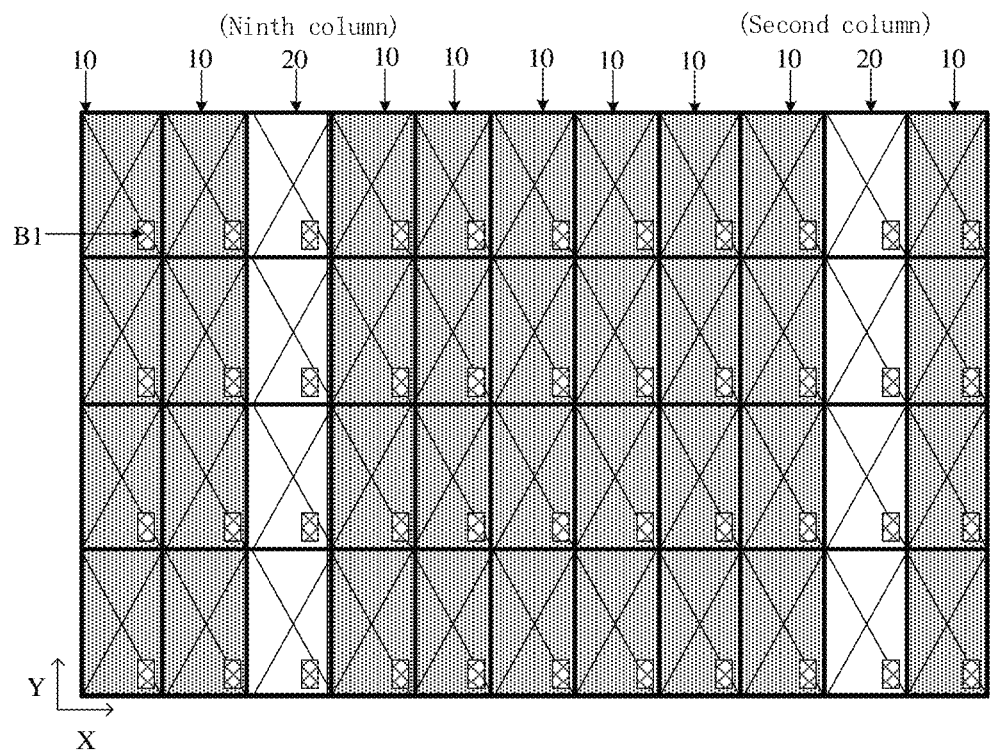
FIG. 10 is a schematic structural diagram of some pixel circuits in the display panel as shown in FIG. 2.
Figure 11:
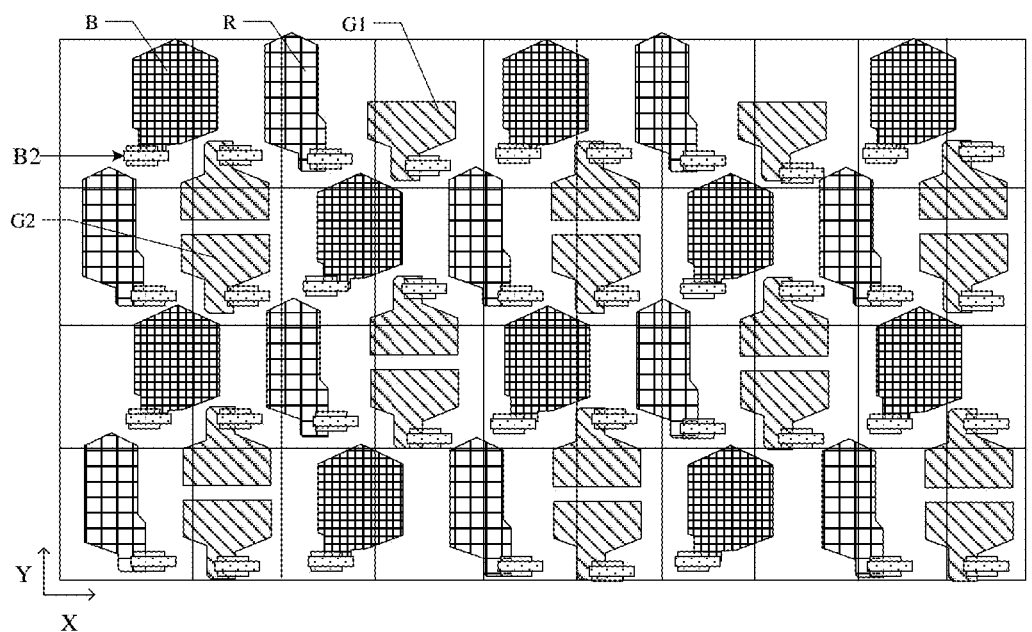
FIG. 11 is a schematic structural diagram of some light-emitting elements in the display panel as shown in FIG. 2.

FIG. 9 is a partial structural diagram of a first display region A1. FIG. 10 is a schematic diagram of the structure of some pixel circuits in the display panel as shown in FIG. 2, and FIG. 11 is a schematic diagram of the structure of some light-emitting elements in the display panel shown in FIG. 2. As shown in FIGS. 1 to 11, the width of the pixel circuit is smaller than that of the light-emitting element, so that the pixel circuits in the second column and ninth column in the first display region are not connected with any first light-emitting elements 30, and are the added columns of pixel circuits, which can be used as the second pixel circuit 20 to connect the second light-emitting elements 40 in the second display region A2. For example, the plurality of first light-emitting elements 30 may include four kinds of light-emitting elements: R (a red light-emitting element), G1 (a first green light-emitting element), B (a blue light-emitting element), and G2 (a second green light-emitting element), and each light-emitting element includes a transfer portion B2 connected with the first pixel circuit 10. The connecting portion B1 of the first pixel circuit 10 and the connecting portion B2 of the first light-emitting element 30 may be connected by a conductive layer, for example, the conductive layer may be a source-drain metal layer SD2. Of course, the present disclosure is not limited thereto, and the first pixel circuit 10 and the first light-emitting element 30 can be overlapped together, without providing the source-drain metal layer SD2 to connect them.

For example, at least one second pixel circuit 20 and at least one second light-emitting element 40 may both have a transfer portion, and the transfer portion of at least one second pixel circuit 20 and the transfer portion of at least one second light-emitting element 40 may be electrically connected by the conductive line L1.

In order to ensure sufficient space for setting the conductive line L1, the axis extending in the row direction of the transfer portion of each second pixel circuit 20 may be in a straight line with the axis extending in the row direction of the transfer portion of any second light-emitting element 40 located in the same row as the second pixel circuit 20. For example, in the second pixel circuits 20 and the second light-emitting elements 40 located in the same row, the transfer portion of the second pixel circuit 20 and the transfer portion of the second light-emitting element 40 are on the same straight line. Similarly, in the first pixel circuit 10 and the first light-emitting element 30 located in the same row, the transfer portion B1 of the first pixel circuit 10 and the transfer portion B2 of the first light-emitting element 30 can also be located on the same straight line, so that the trace can be arranged neatly.

Figure 12:
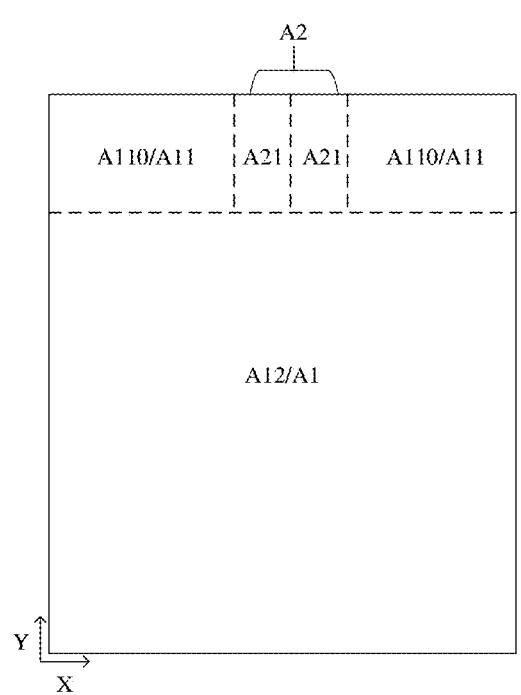
FIG. 12 is a schematic plan view of the display panel as shown in FIG. 1.

FIG. 12 is a schematic plan view of the display panel as shown in FIG. 1. As shown in FIG. 12, the first display region A1 may include a first sub-display region A11 and a second sub-display region A12 arranged along the second direction Y. The first sub-display region A11 may include two symmetrical target sub-display regions A110. For example, the layout of the two target sub-display regions A110 is the same. The second display region A2 may include two third sub-display regions A21 symmetrically arranged. For example, the layouts of the two third sub-display regions A21 are the same. For example, one target sub-display region A110, the second display region A2, and the other target sub-display region A110 may be sequentially arranged along the first direction X.

For example, a left half and a right half of the display panel in the present disclosure have the same layout. Therefore, the following embodiments only show the left half structure of the display panel, that is, a target sub-display region A110 and an adjacent third sub-display region A21 located in the left half. The right part is the same as the left part, so the repetition will not be repeated herein again.

For example, the above-mentioned added columns of pixel circuits, that is, the plurality of second pixel circuits 20, can be dispersed in the first display region A1, and their disposed positions can be flexibly adjusted according to the requirements, as long as the plurality of second pixel circuits 20 can be effectively connected with the second light-emitting element 40 and drive the second light-emitting element 40 to emit light reliably. For example, in the embodiment of the present disclosure, taking the plurality of second pixel circuits 20 scattered in the column direction, the row direction and the diagonal direction as an example, the following schematic explanation is made on the installation positions of the second pixel circuits 20.

Figure 13:
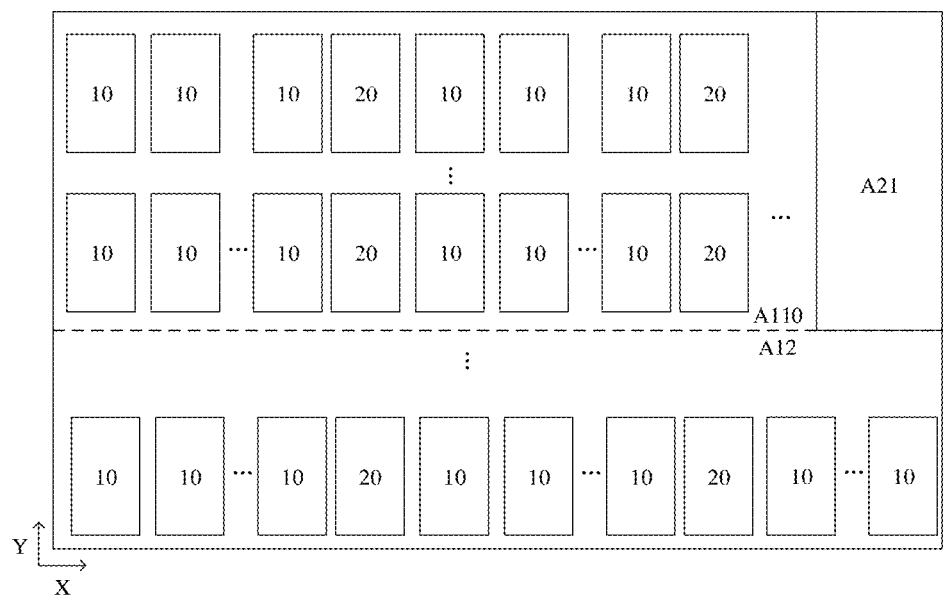
FIG. 13 is a partially enlarged schematic diagram of the pixel circuit of the display panel as shown in FIG. 12.
Figure 14:
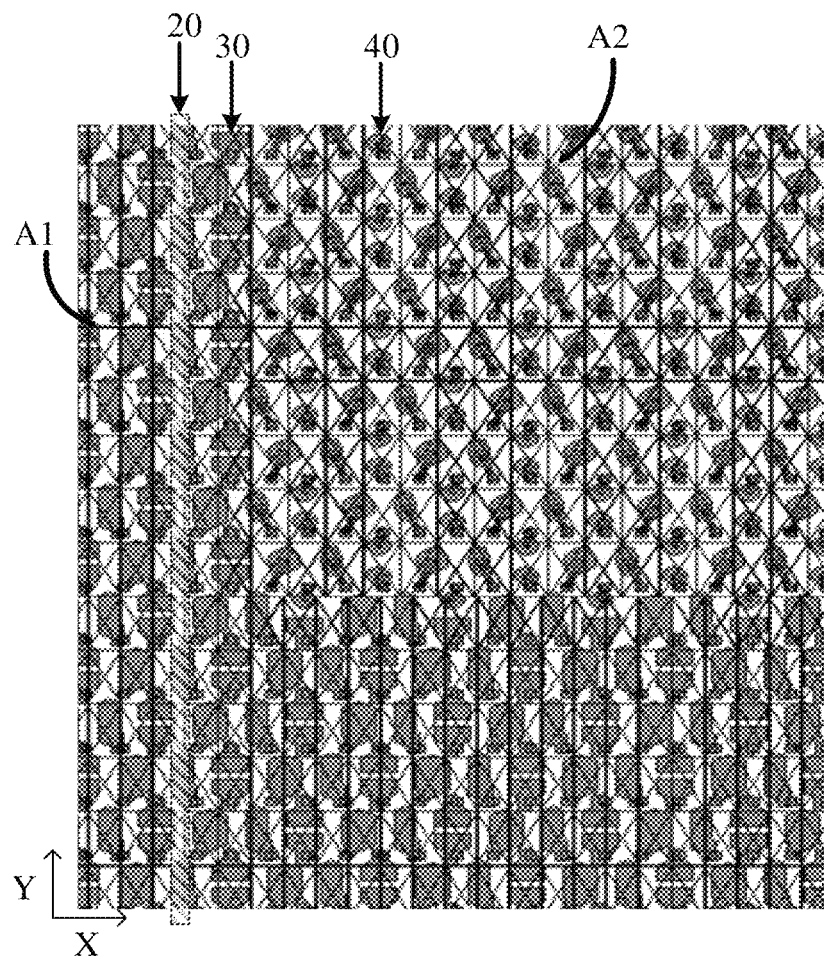
FIG. 14 is a schematic diagram of some light-emitting elements in the third sub-display region and the target sub-display region shown in FIG. 13.

FIG. 13 is a partially enlarged schematic diagram of the pixel circuit of the display panel shown in FIG. 12, and FIG. 14 is a schematic diagram of some light-emitting elements in the third sub-display region and the target sub-display region shown in FIG. 13. As shown in FIGS. 1 to 14, a plurality of first pixel circuits 10 may include a plurality of columns of first pixel circuits 10 extending in the second direction Y and arranged in the first direction X, and a plurality of second pixel circuits 20 may include a plurality of columns of second pixel circuits 20 extending in the second direction Y and arranged in the first direction X. At least one column of first pixel circuits 10 is arranged between two adjacent columns of second pixel circuits 20. In the present disclosure, the column direction and the row direction can be interchanged. For example, the plurality of first pixel circuits may also include a plurality of rows of first pixel circuits, and the plurality of second pixel circuits may include a plurality of rows of second pixel circuits.

For example, the same amount of columns of first pixel circuits 10 can be arranged between any two adjacent columns of second pixel circuits 20, so that the arrangement of pixel circuits can be uniform. For example, eight columns of first pixel circuits 10 are arranged between any two adjacent columns of second pixel circuits 20. For example, different amount of columns of first pixel circuits 10 can be arranged between any two adjacent columns of second pixel circuits 20.

For example, as shown in FIG. 14, from a left boundary between the third sub-display region A21 and the target sub-display region A110 as a starting position, the pixel circuits in a second column and the pixel circuits in a twelfth column to the left may both be the second pixel circuits 20. For example, the second pixel circuits 20 in the added columns below the second display region A2 may be dummy columns, which are not connected with any light-emitting elements.

Figure 15:
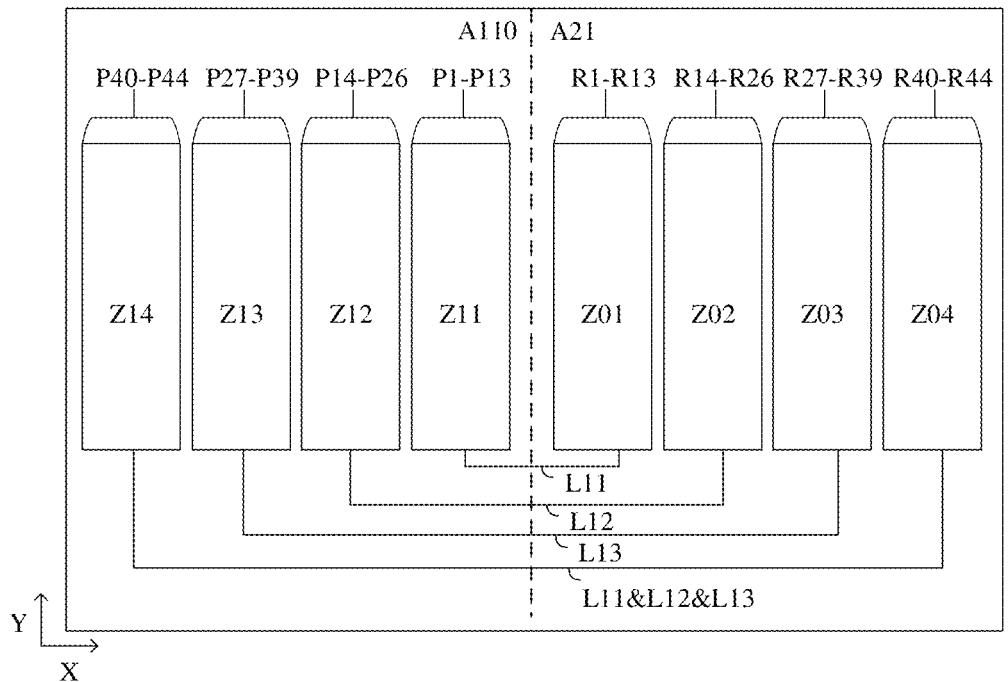
FIG. 15 is a schematic diagram of the connection between the second light-emitting element of the third sub-display region and the second pixel circuit of the target sub-display region located at one side of the third sub-display region.

FIG. 15 is a schematic diagram of the connection between the second light-emitting element of the third sub-display region and the second pixel circuit of the target sub-display region located at one side of the third sub-display region. As shown in FIG. 1 to FIG. 15, the added columns of pixel circuits, that is, the second pixel circuits 20, and the second light-emitting element 40 can be connected by the conductive line L1, and the stacked layers of the conductive line L1 can be flexibly adjusted according to the radius of a light transmission hole. For example, as shown in FIG. 15, the conductive line L1 in the display panel may include three conductive line layers, such as a first conductive line L11 (for example, ITO1), a second conductive line L12 (for example, ITO2) and a third conductive line L13 (for example, ITO3).

For example, as shown in FIGS. 1 to 15, each third sub-display region A21 may include k light-emitting element groups. Each light-emitting element group may include a plurality of columns of second light-emitting elements 40, and a first light-emitting element group to a k-th light-emitting element group may be sequentially arranged along a direction indicated by an arrow in the X direction. For example, each target sub-display region A110 includes k pixel circuit groups which are in one-to-one correspondence with k light-emitting element groups Z0. Each pixel circuit group may include a plurality of columns of second pixel circuits 20, and the first pixel circuit group to the k-th pixel circuit group may be sequentially arranged in a direction opposite to the direction indicated by the arrow in the X direction.

For example, the above k can be an integer greater than 0. For example, the embodiment shown in FIG. 15 is illustrated by taking k as 4, but is not limited thereto, and k may be less than 4 or more than 4. For example, each of the first light-emitting element group Z01 to third light-emitting element group Z03 may include thirteen columns of second light-emitting elements 40. A fifth light-emitting element group Z04 may include five columns of second light-emitting elements 40. For example, each of the first pixel circuit group Z11 to the third pixel circuit group Z13 may include thirteen columns of second pixel circuits 20. The fifth pixel circuit group Z14 may include five columns of second pixel circuits 20.

For example, as shown in FIGS. 1 to 15, in the third sub-display region A21, the first light-emitting element group Z01 includes the first column of second light-emitting elements 40 to the thirteenth column of second light-emitting elements 40 (i.e., R1 to R13); the second light-emitting element group Z02 includes the fourteenth column of second light-emitting elements 40 to the twenty-sixth column of second light-emitting elements 40 (i.e., R14 to R26); the third light-emitting element group Z03 includes the twenty-seventh column of second light-emitting elements 40 to the thirty-ninth column of second light-emitting elements 40 (i.e., R27 to R39); the fourth light-emitting element group Z04 includes the fortieth column second light-emitting elements 40 to the forty-fourth column second light-emitting elements 40 (i.e., R40 to R44).

For example, in the target sub-display region A110, the first pixel circuit group Z11 includes the first column of second pixel circuits 20 to the thirteenth column of second pixel circuits 20 (i.e., P1 to P13); the second pixel circuit group Z12 includes the fourteenth column second pixel circuit 20 to the twenty-sixth column second pixel circuit 20 (i.e., P14 to P26); the third pixel circuit group Z13 includes the twenty-seventh column second pixel circuit 20 to the thirty-ninth column second pixel circuit 20 (i.e., P27 to P39);

the fourth pixel circuit group Z14 includes the fortieth column second pixel circuit 20 to the forty-fourth column second pixel circuit 20 (i.e., P40 to P44). FIG. 15 does not show the first pixel circuit 10 and the first light-emitting element 30.

For example, each second light-emitting element 40 in each light-emitting element group and each second pixel circuit 20 in a corresponding pixel circuit group may be connected by the first conductive line L11, the second conductive line L12 and/or the third conductive line L13.

Figure 16:
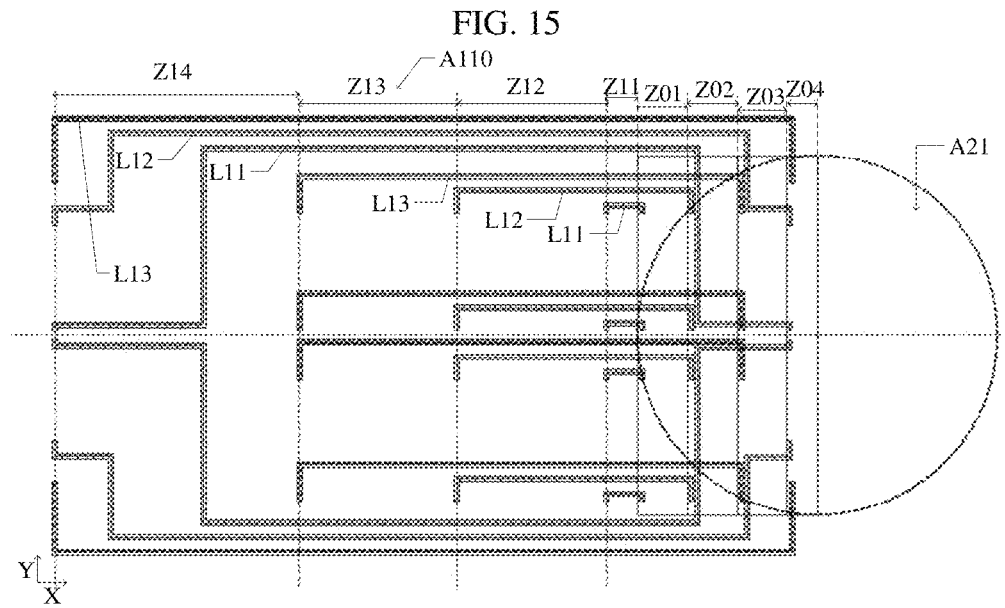
FIG. 16 is a distribution diagram of some conductive lines in the display panel as shown in FIG. 15.

For example, FIG. 16 is a distribution diagram of some conductive lines in the display panel shown in FIG. 15. As shown in FIG. 15 and FIG. 16, for example, taking the case that each row of pixels is provided with at most thirteen conductive lines L (the number of conductive lines L is limited by the width of the conductive lines L and a size of a pixel) as an example, then each row of pixels in the display panel can be provided with thirteen first conductive lines L11, thirteen second conductive lines L12 or thirteen third conductive lines L13, and the conductive lines in the same layer cannot overlap, and some conductive lines in different layers can be connected through via holes.

For example, as shown in FIGS. 15 to 16, the second light-emitting element in the first light-emitting element group Z01 is connected with the second pixel circuit in the first pixel circuit group Z11 through the first conductive line L11; the second light-emitting element in the second light-emitting element group Z02 is connected with the second pixel circuit in the second pixel circuit group Z12 through the second conductive line L12; the second light-emitting element in the third light-emitting element group Z03 is connected with the second pixel circuit in the third pixel circuit group Z13 through the third conductive line L13; in the fourth light-emitting element group Z04, some second light-emitting elements are connected with the corresponding second pixel circuits in the fourth pixel circuit group Z14 through the first conductive line L11, some second light-emitting elements are connected with the corresponding second pixel circuits in the fourth pixel circuit group Z14 through the second conductive line L12, and some second light-emitting elements are connected with the corresponding second pixel circuits in the fourth pixel circuit group Z14 through the third conductive line L13.

For example, one row of second light-emitting elements in the first light-emitting element group Z01 is connected with one row of second pixel circuits in the first pixel circuit group Z11 through thirteen first conductive lines L11; one row of second light-emitting elements in the second light-emitting element group Z02 is connected with one row of second pixel circuits in the second pixel circuit group Z12 through thirteen second conductive lines L12; and one row of second light-emitting elements in the third light-emitting element group Z03 is connected with one row of second pixel circuits in the third pixel circuit group Z13 through thirteen third conductive lines L13.

For example, as shown in FIG. 16, the first conductive line L11 connected with some second light-emitting elements in the fourth light-emitting element group Z04 passes through the second light-emitting element group Z02, a part of a region where the third light-emitting element group Z03 and a part of a region where the fourth light-emitting element group Z04 are located; the second conductive line L12 connected with some second light-emitting elements in the fourth light-emitting element group Z04 passes through a part of the region where the third light-emitting element group Z03 is located and a part of the region where the fourth light-emitting element group Z04 is located; the third conductive line L13 connected with some second light-emitting elements in the fourth light-emitting element group Z04 passes through a part of the region where the fourth light-emitting element group Z04 is located. The positions of the conductive lines L11~L13 connected with the second light-emitting elements in the fourth light-emitting element group Z04 should be set so that there are at most thirteen conductive lines in adjacent row of pixels. FIG. 16 only schematically shows the arrangement of some conductive lines connected with the light-emitting elements in the half region of the second display region. The conductive lines connected with the light-emitting elements in the other half region of the second display region and the conductive lines connected with the light-emitting elements in the half region shown in FIG. 16 are symmetrically distributed with a center line of the second display region extending in the Y direction as the central axis.

In the research, the inventor of the present application found that, as shown in FIGS. 15 and 16, taking the space where the conductive lines connected with the first light-emitting element group Z01 to the third light-emitting element group Z03 are located as a main trace region, the conductive lines connecting the second light-emitting element in the fourth light-emitting element group Z04 and the fourth pixel circuit group Z14 are routed from the space above or below the main trace region without crossing the main trace region. The lengths of the part of conductive lines (L11 & L12 & L13) are significantly larger than those of the conductive lines (for example, the first conductive line L11) located in the main trace region.

As shown in FIGS. 15 and 16, the distance between the second light-emitting elements R1 to R44 located in the second display region in the X direction is small (i.e., the distance between the second light-emitting elements in adjacent columns is small), the distance between the second light-emitting elements R1 and R44 is small, while the distance between the pixel circuits P1 to P44 in the added columns connected with the second light-emitting elements R1 to R44 are large in the row direction (i.e., the distance between the second pixel circuits in adjacent columns is large). Then the distance between the second pixel circuit P1 and the second pixel circuit P44 is large, thereby resulting in that the line length (the shortest line length) of the conductive line connecting the second light-emitting element R1 and the second pixel circuit P1 is much smaller than the line length (the longest line length) of the conductive line connecting the second light-emitting element R44 and the second pixel circuit P44. For example, the ratio of the shortest line length to the longest line length can range from 2% to 4%. Therefore, the line length of the conductive line connecting the second light-emitting element R44 and the second pixel circuit P44 is very long, and it has a great resistance. Moreover, the excessive difference between the shortest line length and the longest line length will lead to excessive resistance difference among different conductive lines, which will affect the display effect of the second display region.

The embodiment in the present disclosure provides a display panel and a display device, the display panel includes a base substrate. The display panel includes a first display region and a second display region, the second display region is on at least one side of the first display region in a first direction, the first display region includes a plurality of first light-emitting units on the base substrate, and the second display region includes a plurality of second light-emitting units, a plurality of first pixel circuits and a plurality of second pixel circuits on the base substrate, at least one of the plurality of first pixel circuits is between adjacent second pixel circuits, at least one of the plurality of first pixel circuits is connected with at least one of the plurality of first light-emitting units, and at least one of the plurality of second pixel circuits is connected with at least one of the plurality of second light-emitting units. The display panel also includes a plurality of traces on the base substrate and configured to connect the first pixel circuit and a corresponding first light-emitting unit. The first display region includes a plurality of regions arranged along the first direction, the plurality of regions include a first region and a second region, the second display region includes a third region and a fourth region arranged along the first direction, a first light-emitting unit in the first region is connected with a first pixel circuit in the third region, a first light-emitting unit in the second region is connected with a first pixel circuit in the fourth region, the fourth region is on a side of the third region close to the first display region, and the first region is on a side of the second region close to the second display region. According to the embodiment of the present disclosure, by setting the position of the first pixel circuit connected with the first light-emitting unit in the first display region, the length difference of the traces connecting a plurality of first light-emitting units and a plurality of first pixel circuits can be reduced as much as possible, and the resistance difference of traces with different lengths can be reduced, thereby improving the display effect of the display panel.

The display panel and display device provided by the embodiments of the present disclosure are described below with reference to the drawings.

Figure 17:
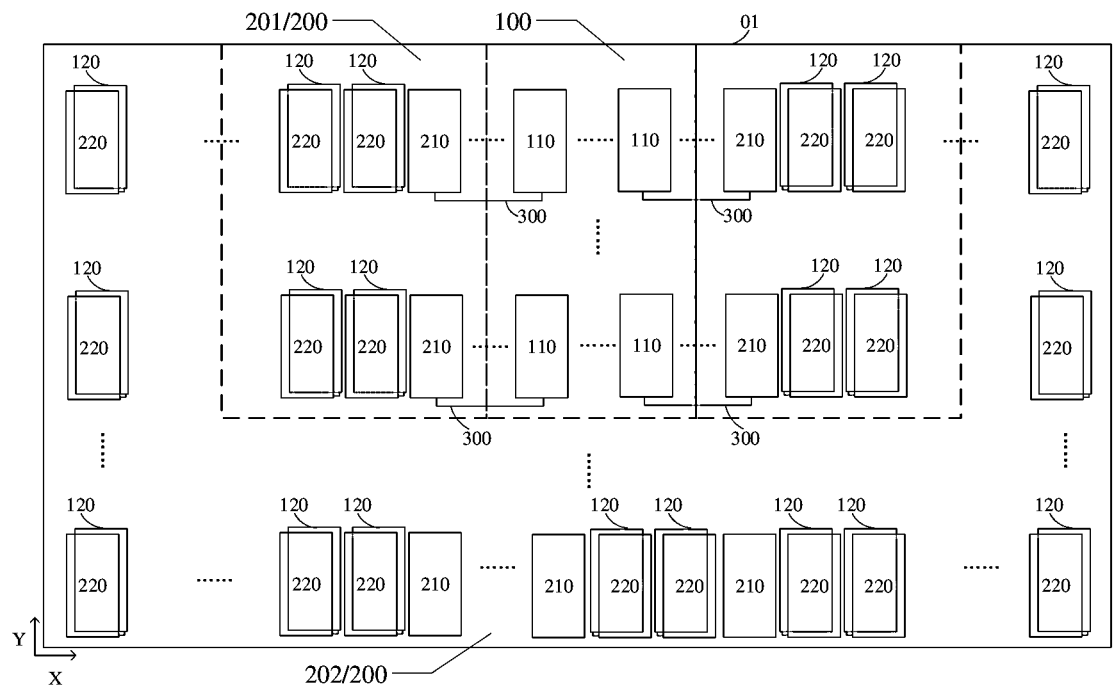
FIG. 17 is a schematic diagram of a partial plane structure of a display panel provided by an embodiment of the present disclosure.
Figure 18:
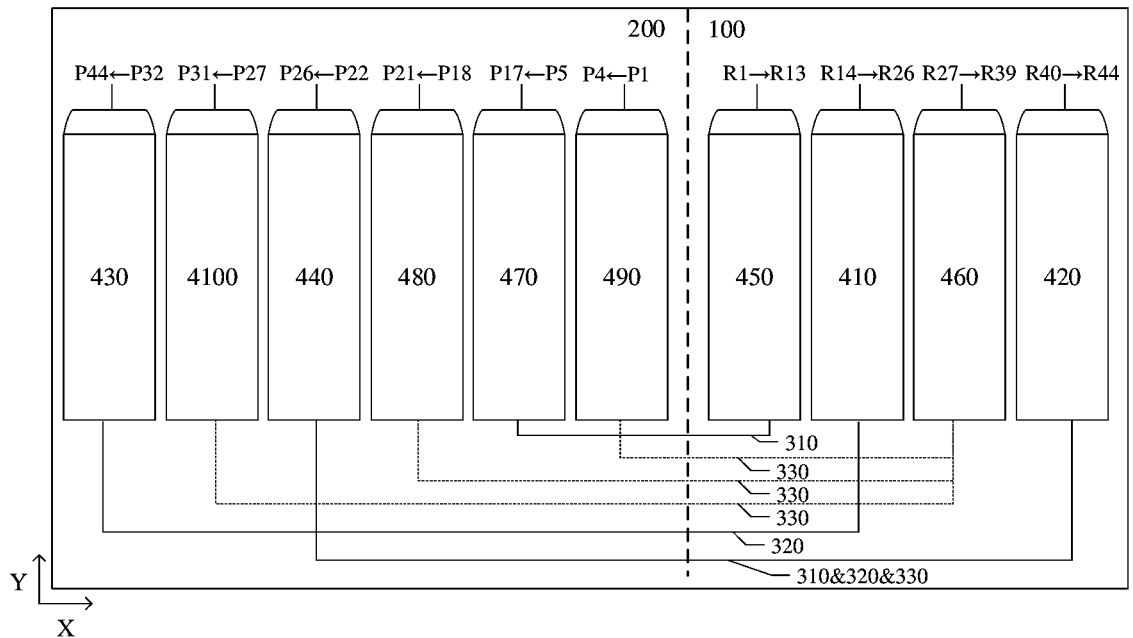
FIG. 18 is a schematic diagram of a partial plane structure of the display panel as shown in FIG. 17.

FIG. 17 is a partial plane structure diagram of a display panel provided by an embodiment of the present disclosure, and FIG. 18 is a partial plane structure diagram of the display panel shown in FIG. 17. As shown in FIGS. 17 and 18, the display panel includes a base substrate 01. The display panel includes a first display region 100 and a second display region 200, and the second display region 200 is located on at least one side of the first display region 100 in the first direction. The embodiment of the present disclosure takes the X direction shown in FIG. 17 as the first direction. For example, the second display region 200 is located on both sides of the first display region 100 in the first direction. The first display region 100 includes a plurality of first light-emitting units 110 on the base substrate 01, and the second display region 200 includes a plurality of second light-emitting units 120, a plurality of first pixel circuits 210 and a plurality of second pixel circuits 220 on the base substrate 01. In the first direction, at least one second pixel circuit 220 is arranged between two adjacent first pixel circuits 210, at least one of the plurality of first pixel circuits 210 is connected with at least one of the plurality of first light-emitting units 110, and at least one of the plurality of second pixel circuits 220 is connected with at least one of the plurality of second light-emitting units 120. The display panel further includes a plurality of traces 300 located on the base substrate 01, and the plurality of traces 300 are configured to connect the first pixel circuit 210 and the corresponding first light-emitting unit 110. Here, the trace 300 and the conductive line L1 in the display panel shown in FIGS. 1 to 16 play a role in connecting the first light-emitting unit and the first pixel circuit located in different regions.

As shown in FIGS. 17 and 18, the first display region 100 includes a plurality of regions arranged in a first direction, the plurality of regions includes a first region 410 and a second region 420, and the second display region 20 includes a third region 430 and a fourth region 440 arranged in the first direction. The first light-emitting unit 110 in the first region 410 is connected with the first pixel circuit 210 in the third region 430, the first light-emitting unit 110 in the second region 420 is connected with the first pixel circuit 210 in the fourth region 440, the fourth region 440 is located on a side of the third region 430 close to the first display region 100, and the first region 410 is located on a side of the second region 420 close to the second display region 200. According to the embodiment of the present disclosure, by setting the position of the first pixel circuit connected with the first light-emitting unit in the first display region, the length difference of the traces connecting the plurality of first light-emitting units and the plurality of first pixel circuits can be reduced as much as possible, and the resistance difference of traces with different lengths can be reduced, thereby improving the display effect of the display panel.

The first display region 100 in the embodiment of the present disclosure may have the same position distribution as the second display region A2 in FIGS. 1 to 12, and the second display region 200 in the embodiment of the present disclosure may have the same position distribution as the first display region A1 in FIGS. 1 and 12. Therefore, The first light-emitting unit 110, the first pixel circuit 210, the second light-emitting unit 120 and the second pixel circuit 220 in the embodiment of the present disclosure have the same position distribution as the second light-emitting element 40, the second pixel circuit 20, the first light-emitting element 30 and the first pixel circuit 10 in the display panel shown in FIGS. 1 to 12, respectively. For example, the plurality of second pixel circuits include a plurality of columns of second pixel circuits extending in a second direction intersecting the first direction and arranged in the first direction, and the plurality of first pixel circuits include a plurality of columns of first pixel circuits extending in the second direction and arranged in the first direction; at least one column of second pixel circuits is distributed between two adjacent columns of first pixel circuits, that is, both the first pixel circuits and the second pixel circuits in the embodiment of the present disclosure are compressed pixel circuits.

The connection relationship between the second light-emitting unit 120 and the second pixel circuit 220 in the embodiment of the present disclosure is the same as that between the first light-emitting element 30 and the first pixel circuit 10 in the display panel shown in FIGS. 1 to 12. Each light-emitting unit in the embodiment of the present disclosure can also be called a light-emitting element, and can have the same structure as the light-emitting elements shown in FIGS. 1 to 16. For example, the light-emitting unit includes a first electrode, a light-emitting layer, and a second electrode which is located on a side of the light-emitting layer facing the base substrate, and the second electrode of the light-emitting unit is configured to be connected with a pixel circuit. For example, the light-emitting unit may include a blue light-emitting unit, a red light-emitting unit, and a green light-emitting unit. The shape of the light-emitting unit in the first display region of the embodiment of the present disclosure (including the shape of the light-emitting region and the shape of the second electrode) may be the same as the shape of the light-emitting elements with the same color in the second display region of the display panel shown in FIGS. 1 to 16 (including the shape of the light-emitting region and the shape of the second electrode), and the description thereof will not be repeated herein again.

The above-mentioned "light-emitting region" may refer to a two-dimensional planar region parallel to the base substrate. For example, the display panel further includes a pixel defining layer on the base substrate, which includes an opening for defining the light-emitting region of the light-emitting unit, the opening exposes the second electrode of the light-emitting unit. In the case where at least part of the light-emitting layer of the light-emitting unit is formed in the opening of the pixel defining layer, the light-emitting layer located in the opening is in contact with the second electrode, so that this part can drive the light-emitting layer to emit light to form the light-emitting region. For example, an orthographic projection of the light-emitting region on the base substrate is approximately coincident with an orthographic projection of the opening of the corresponding pixel defining layer on the base substrate. For example, the orthographic projection of the light-emitting region on the base substrate completely falls within the orthographic projection of the opening of the corresponding pixel defining layer on the base substrate, and the two shapes are similar. The projection area of the light-emitting region on the base substrate is slightly smaller than that of the opening of the corresponding pixel defining layer on the base substrate.

As shown in FIGS. 17 to 18, the connection relationship between the first light-emitting unit 120 and the first pixel circuit 210 in the embodiment of the present disclosure is at least partially different from the connection relationship between the second light-emitting element 40 and the second pixel circuit 20 in the display panel shown in FIGS. 15 to 16.

For the display panel shown in FIG. 15 to FIG. 16, the pixel circuit layout shown in FIG. 7 is the pixel circuit layout where the first pixel circuit 10 is connected with the first light-emitting element 30, while the second pixel circuit 20 and the second light-emitting element 40 need to be connected by a conductive line, such as an ITO trace, which is equivalent to that the resistance of the ITO trace is formed at the connection between the second light-emitting element 40 and the second pixel circuit 30, or the load formed by the resistance of the ITO trace and parasitic capacitance generated by the ITO trace and other film structures are formed at the connection between the second light-emitting element 40 and the second pixel circuit 30. Therefore, for the second display region of the display panel shown in FIGS. 15 to 16, the length of each conductive line and the length difference of different conductive lines will have a great influence on the display effect.

For example, the plurality of traces 300 include transparent traces. For example, the material of the transparent trace may include indium tin oxide (ITO), indium gallium zinc oxide (IGZO) or indium zinc oxide (IZO).

For example, as shown in FIGS. 17 and 18, the plurality of traces 300 include a plurality of traces distributed in different layers, and the plurality of traces distributed in different layers sequentially include a first trace layer 310, a second trace layer 320, and a third trace layer 330 in the direction perpendicular to the base substrate 01, the first trace layer 310 is located between the second trace layer 320 and the base substrate 01. The first trace layer 310 in the display panel shown in FIGS. 17 and 18 may be the same layer as the first conductive line L11 in the display panel shown in FIGS. 15 and 16, the second trace layer 320 in the display panel shown in FIGS. 17 and 18 may be the same layer as the second conductive line L12 in the display panel shown in FIGS. 15 and 16, and the third trace layer 330 in the display panel shown in FIGS. 17 and 18 may be the same layer as the third conductive line L13 in the display panel shown in FIGS. 15 and 16.

For example, as shown in FIGS. 17 and 18, the plurality of regions further include a fifth region 450 and a sixth region 460, the fifth region 450 is located on a side of the first region 410 close to the second display region 200, the sixth region 460 is located between the first region 410 and the second region 420, and the first light-emitting unit 110 of the fifth region 450 is connected with the first trace layer 310. The first light-emitting unit 110 of the first region 410 is connected with the second trace layer 320, the first light-emitting unit 110 of the sixth region 460 is connected with the third trace layer 330, the first light-emitting unit 110 of the second region 420 is connected with at least one of the first trace layer 310, the second trace layer 320 and the third trace layer 330, and the second region 420 is the farthest one from the second display region 200 among the plurality of regions.

Compared with the display panel shown in FIG. 15 in which the fourth light-emitting element group farthest from the first display region and the fourth pixel circuit group farthest from the second display region are connected, the first pixel circuit connected with the first light-emitting unit in the second region farthest from the second display region is set in the fourth region, and the fourth region is located on a side of the third region facing the first display region, that is, the fourth region is not the farthest region from the first display region. Therefore, the length of the trace connected with the first light-emitting unit in the farthest region from the second display region can be reduced, and the resistance of this part of trace can be further reduced. For example, the parasitic capacitance generated by this part of trace and other film structures can also be reduced, and the display effect of the first display region can be improved.

It should be noted that the second display region 200 shown in FIG. 17 includes a first sub-display region 201 and a second sub-display region 202. The first pixel circuit 210 provided in the first sub-display region 201 is configured to be connected with the first light-emitting unit 110, while the first pixel circuit 210 provided in the second sub-display region 202 may be a dummy pixel circuit, which is not connected with the first light-emitting unit 110. FIG. 18 shows only a part of the first display region, which is a quarter of the complete first display region 100 (one of the four regions divided by two central axes in the X direction and the Y direction in the first display region), such as the upper left corner of the complete first display region 100. The connection relationship between the first light-emitting units in the other three quarters of the first display region and the first pixel circuits in the second display region is the same as the connection relationship between the first light-emitting units in the quarter of the first display region and the first pixel circuits in the second display region.

Figure 19:
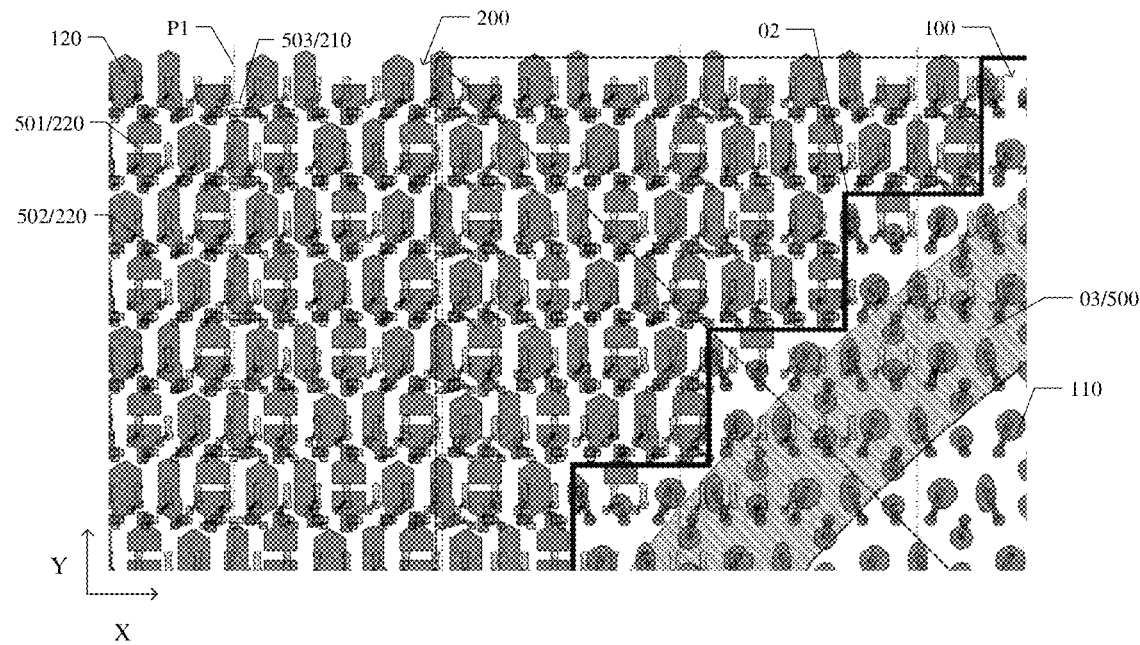
FIG. 19 is a schematic plan view of a second electrode of the light-emitting unit and a first conductive layer at a junction position of the first display region and the second display region on the display panel.
Figure 20:
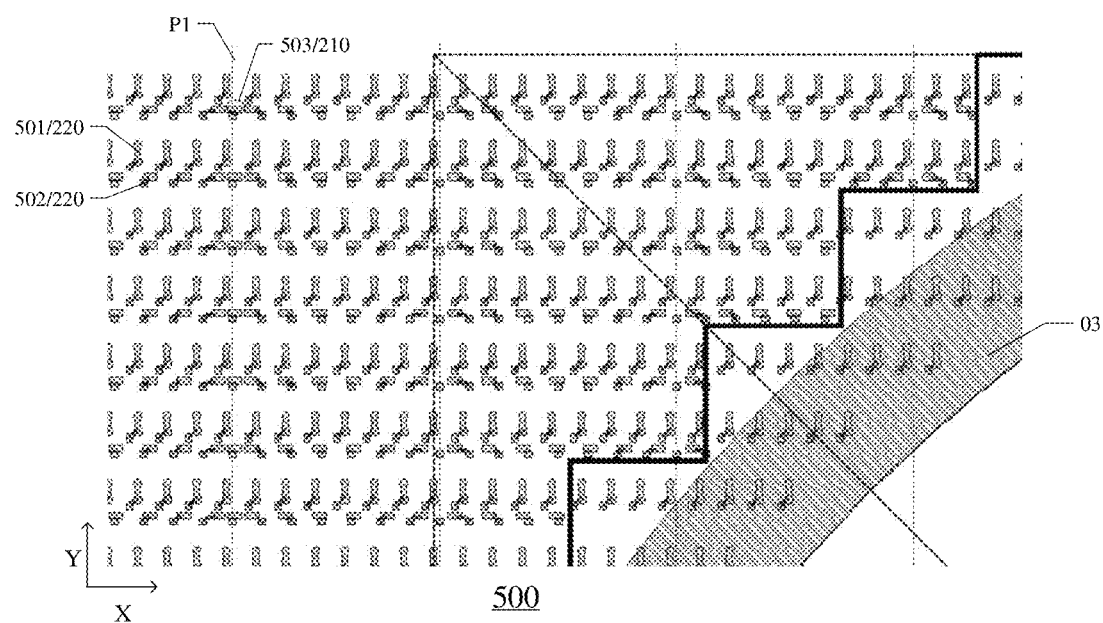
FIG. 20 is a schematic plan view of a first conductive layer at the junction position of the first display region and the second display region in the display panel as shown in FIG. 19.

For example, FIG. 19 is a schematic plan view of the second electrode and the first conductive layer of the light-emitting unit at a junction position of the first display region and the second display region on the display panel, and FIG. 20 is a schematic plan view of the first conductive layer at the junction position of the first display region and the second display region in the display panel shown in FIG. 19. As shown in FIGS. 19 and 20, the display panel includes a first conductive layer 500, which may be located on the side of the second electrode of the light-emitting unit facing the base substrate. For example, the display panel further includes a second conductive layer where data lines and power signal lines are located, a third conductive layer where gate lines are located, and a semiconductor layer where channels of transistors are located. The third conductive layer is located on a side of the semiconductor layer away from the base substrate, the second conductive layer is located on a side of the third conductive layer away from the base substrate, and the first conductive layer 500 is located between the second conductive layer and the second electrode of the light-emitting unit.

For example, the first conductive layer 500 includes a conductive electrode 501, which can be connected with the power signal line to be supplied with a constant voltage, and the conductive electrode 501 can be used to shield the influence of the trace 300 on the potential of the driving transistor T1.

For example, as shown in FIGS. 19 and 20, the first conductive layer 500 further includes a first connection portion 502 configured to connect the second electrode of the second light-emitting unit with the second light-emitting control transistor T5 of the second pixel circuit. The first conductive layer 500 further includes a second connecting portion 503 configured to connect the second light-emitting control transistor T5 of the first pixel circuit with the trace 300. For example, the above-mentioned first connection portion is provided in the first pixel circuit configured to be connected with the first light-emitting unit. For example, in the case where the indium tin oxide (ITO) is used as the material of the trace, the first transfer portion can also be called an ITO transfer portion.

For example, as shown in FIGS. 19 and 20, the first conductive layer 500 further includes a light shielding portion 03 surrounding the first display region to reduce the influence of diffraction on the lens provided in the first display region. For example, the light shielding portion 03 may be connected with a power signal.

For example, as shown in FIGS. 19 and 20, the boundary between the first display region 100 and the second display region 200 may be a stepped boundary line 02 as shown in the figure, and the step width (i.e., the size along the X direction) and the step height (i.e., the size along the Y direction) at the boundary line between the first display region 100 and the second display region 200 may be arbitrarily set, for example, the step width may be an integer multiple of the sum of the widths of four light-emitting units (e.g., D01 as shown in FIG. 6), that is, 31.6*4*N(N=1, 2, 3 . . . ), and the step height can be an integer multiple of the sum of the heights of two light-emitting units (e.g., D02 shown in FIG. 6), that is, 63.2*2*N(N=1, 2, 3 . . . ).

For example, as shown in FIGS. 19 and 20, at least one column of added-column pixel circuits located between the first column of first pixel circuits P1 near the first display region 100 in the second display region 200 and the first display region 100 is further provided. The at least one column of added-column pixel circuits is not provided with the above-mentioned first connection portion and is not connected with the first light-emitting unit through the trace, and the at least one column of added-column pixel circuits is a dummy pixel circuit. For example, the dummy pixel circuit is arranged around the first display region to improve the etching uniformity around the first display region.

Figure 21:
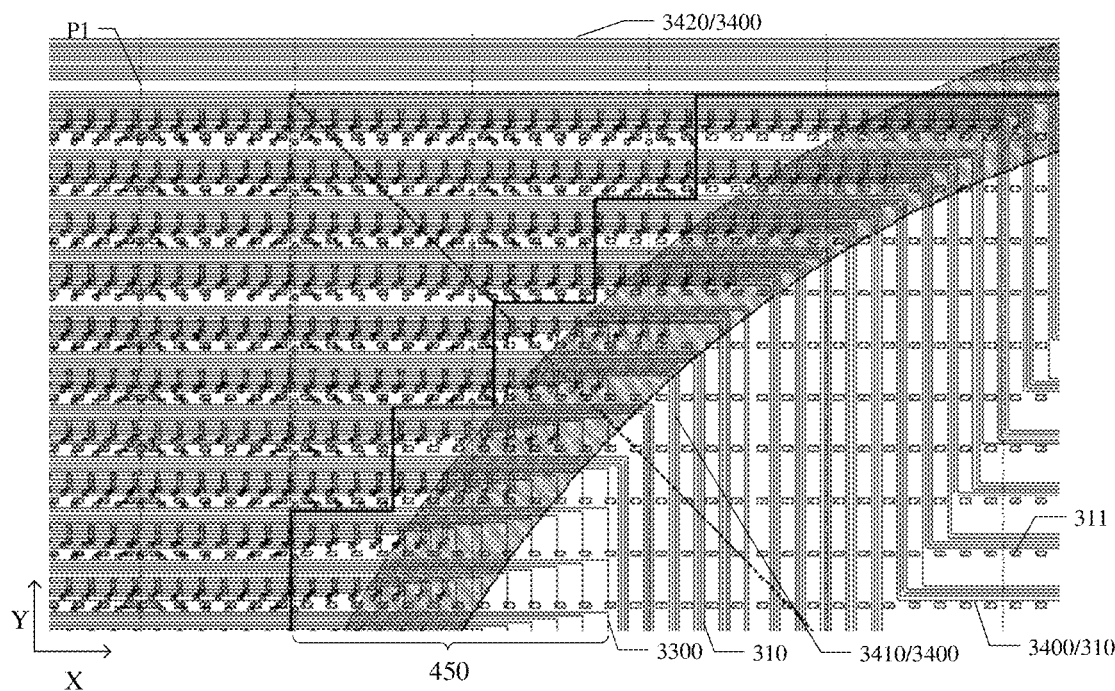
FIG. 21 is a schematic plan view of a first conductive layer and a first trace layer at a junction position of the first display region and the second display region.
Figure 22:
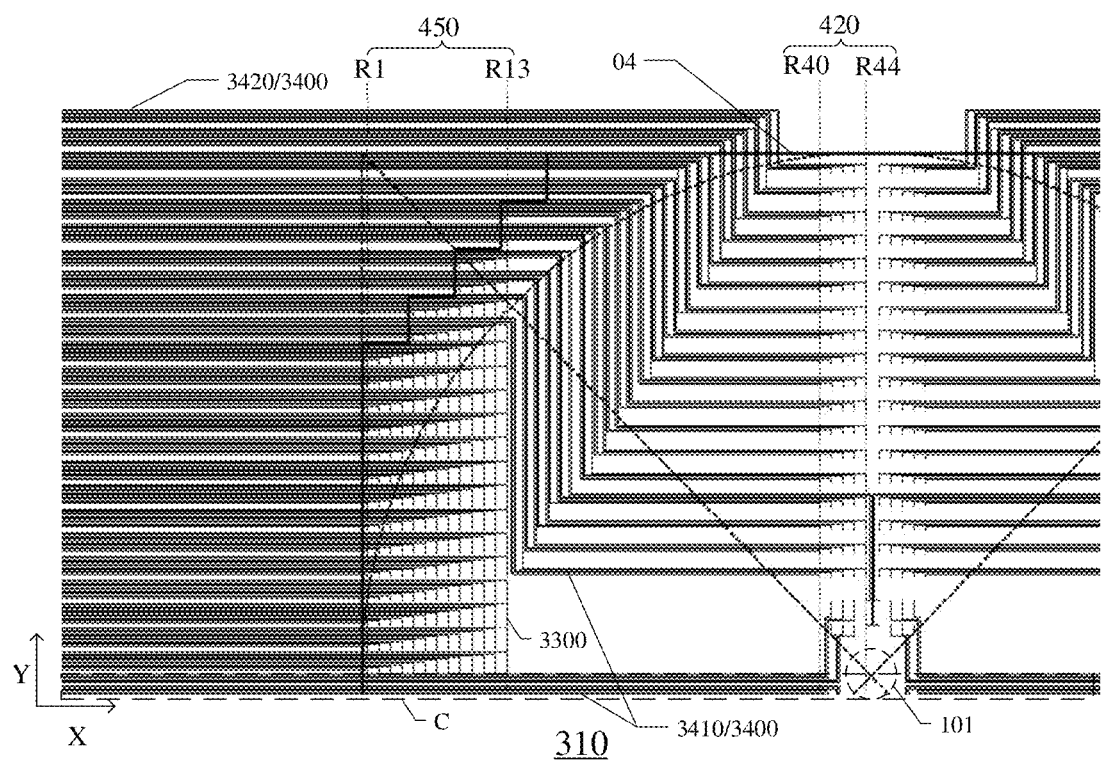
FIG. 22 is a schematic plan view of a first trace layer at a junction position of the first display region and the second display region.
Figure 23:
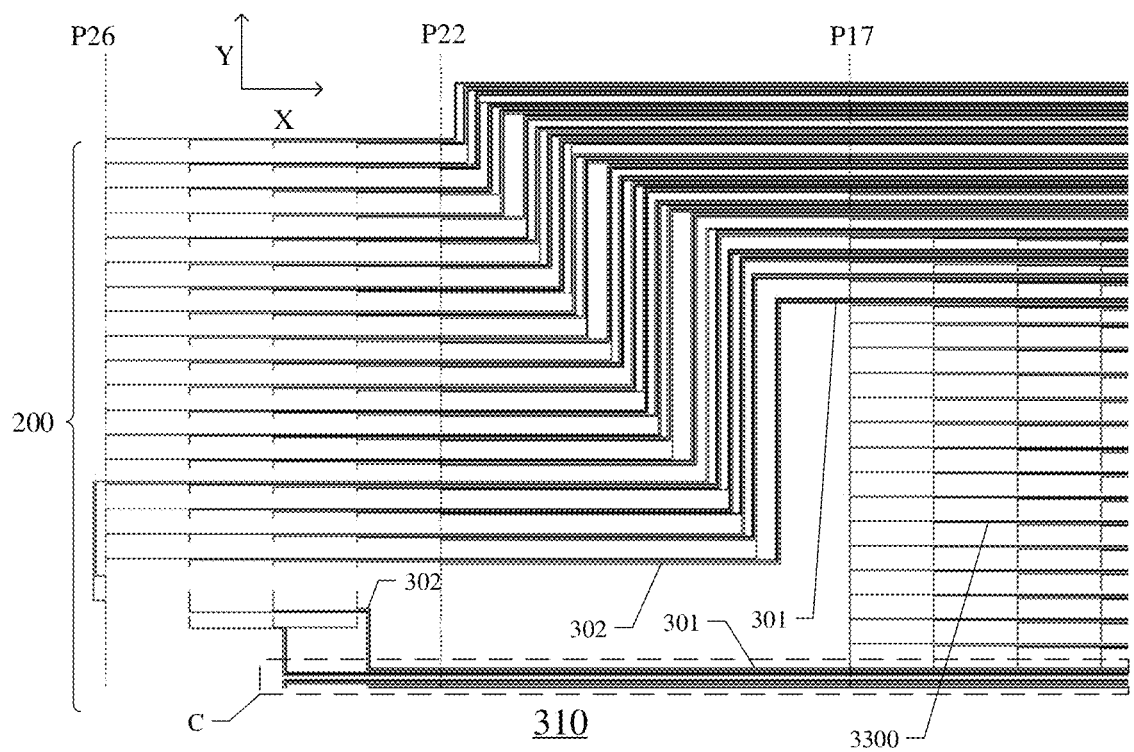
FIG. 23 is a schematic plan view of a first trace layer in a region, away from the first display region, in the second display region.

FIG. 21 is a schematic plan view of a first conductive layer and a first trace layer at a junction position of the first display region and the second display region, FIG. 22 is a schematic plan view of a first trace layer at a junction position of the first display region and the second display region, and FIG. 23 is a schematic plan view of a first trace layer in a region, away from the first display region, in the second display region. As shown in FIGS. 21 to 23, the film layer where the trace is located (including at least one of the first trace layer, the second trace layer and the third trace layer) includes an anode connection portion 311, and the anode connection portion 311 located in the first display region is configured to connect the trace 300 with the second electrode of the first light-emitting unit.

For example, as shown in FIGS. 21 to 23, the trace 300 connected with some of the first light-emitting units in one of the plurality of regions farthest from the second display region 200 (e.g., the second region 420) includes a main portion 301 extending in the first direction and an edge portion 302 extending in the first direction, for example, the edge portion 302 is located on at least one side of the main portion 301 in the first direction. For example, the main portion 301 and the edge portion 302 are located on different straight lines, the length of the main portion 301 is longer than the length of the edge portion 302, and the main portion 301 passes through the second display region 200. For example, the edge portion 302 extends to the corresponding pixel circuit and is connected with the pixel circuit. For example, the main portion 301 and the edge portion 302 may be connected by a line segment extending in the Y direction.

For example, the circular boundary 04 shown in FIG. 22 may be the boundary of the first display region, and the shape of the first display region is circular, but is not limited thereto, and the first display region may have other shapes.

Compared with the display panel shown in FIG. 16, in which the conductive traces connected with the light-emitting elements in the farthest region from the first display region A1 in the second display region A2 are routed from the uppermost side or the lowermost side and then connected with the corresponding pixel circuits in the first display region, in the embodiment of the present disclosure, some of the traces connected with the light-emitting elements in the farthest region from the second display region in the first display region directly pass through the second display region, instead of bypassing the second display region from the uppermost side or the lowermost side and connecting with the corresponding pixel circuit, it can reduce the partial trace lengths of a plurality of trace lines connected with the light-emitting units in the area farthest from the second display region in the first display region, and further improve the display effect of the second display region.

For example, as shown in FIGS. 17 and 18, the ratio of the length of the longest trace 300 in the second trace layer 320 connected with the first light-emitting unit 110 in the first region 410 to the length of the longest trace 300 connected with the first light-emitting unit 110 in the second region 420 ranges from 0.8 to 1.2, which can reduce the parasitic capacitance on the whole trace layer and improve the display effect of the second display region. For example, the ratio of the length of the longest trace 300 in the second trace layer 320 connected with the first light-emitting unit 110 in the first region 410 to the length of the longest trace 300 connected with the first light-emitting unit 110 in the second region 420 ranges from 0.9 to 1.1. For example, the length of the longest trace 300 in the second trace layer 320 connected with the first light-emitting unit 110 in the first region 410 is not less than that of the longest trace 300 connected with the first light-emitting unit 110 in the second region 420.

For example, in the direction perpendicular to the base substrate, the overlapping area between the first trace layer and the third trace layer is large, and the first trace layer has a certain overlapping area with the film layers such as the first conductive layer on the side away from the third trace layer, so the first trace layer has a large parasitic capacitance;

in the direction perpendicular to the base substrate, the overlapping area between the second trace layer and the first trace layer, and the overlapping area between the second trace layer and the third trace layer are both very small, so the second trace layer has a small parasitic capacitance. According to the size relationship between the parasitic capacitance on the first trace layer and the second trace layer, the average length of the trace in the second trace layer is set to be larger than that of the trace in the first trace layer, which can reduce the parasitic capacitance on the whole trace layer.

For example, as shown in FIGS. 17 to 18, the ratio of the average length of the traces 300 connecting the first light-emitting units 110 in the second region 420 and the first pixel circuits 210 in the fourth region 440 to the average length of the traces 300 connecting the first light-emitting units 110 in the first region 410 and the first pixel circuits 210 in the third region 430 may range from 0.7 to 1.3. For example, the ratio of the average length of the traces 300 connecting the first light-emitting units 110 in the second region 420 and the first pixel circuits 210 in the fourth region 440 to the average length of the traces 300 connecting the first light-emitting units 110 in the first region 410 and the first pixel circuits 210 in the third region 430 may range from 0.9 to 1.1. For example, the ratio of the length of the longest trace among the traces 300 connecting the first light-emitting units 110 in the second region 420 and the first pixel circuits 210 in the fourth region 440 to the length of the longest trace among the traces 300 connecting the first light-emitting units 110 in the first region 410 and the first pixel circuits 210 in the third region 430 may range from 0.7 to 1.3. For example, the ratio of the length of the longest trace among the traces 300 connecting the first light-emitting units 110 in the second region 420 and the first pixel circuits 210 in the fourth region 440 to the length of the longest trace among the traces 300 connecting the first light-emitting units 110 in the first region 410 and the first pixel circuits 210 in the third region 430 may range from 0.9 to 1.1.

Compared with the trace mode in the display panel shown in FIGS. 15 and 16, on the one hand, the embodiment of the present disclosure reduces the length of the trace connected with the light-emitting unit in the region farthest from the second display region; on the other hand, in the embodiment of the present disclosure, the longest trace among the plurality of traces connecting the light-emitting units in the first region and the pixel circuits in the third region is set as the longest trace in the display panel, and the ratio of the length of the longest trace to the length of the trace connecting the light-emitting units in the region farthest from the second display region ranges from 0.8 to 1.2. Therefore, the length of the longest trace in the embodiment of the present disclosure is also smaller than that in the display panel shown in FIGS. 15 and 16. In the display panel provided by the embodiment of the present disclosure, by adjusting the position of the first pixel circuits connected with the first light-emitting units in some regions, the longest length of the trace connecting the first light-emitting unit and the first pixel circuit can be effectively reduced, and the resistance and parasitic capacitance of the trace can be reduced, thereby improving the display effect of the second display region.

For example, as shown in FIGS. 17 and 23, the second display region 200 further includes a seventh region 470. The first light-emitting units 110 in the fifth region 450 are connected with the first pixel circuits 210 in the seventh region 470 through a plurality of third traces 3300 in the first trace layer 310, and the seventh region 470 is located on the side of the fourth region 440 facing the first display region 100.

For example, the seventh region 470 is not the region closest to the first display region 100 in the second display region 200, other regions may be provided between the seventh region 470 and the first region 100.

In the embodiment of the present disclosure, the first pixel circuit connected with the first light-emitting unit in the region closest to the second display region is not arranged in the region closest to the first display region, so that the length of the shortest trace among traces can be increased as much as possible, the length difference between the longest trace and the shortest trace among the plurality of traces can be further reduced, the numerical range of the trace resistance can be reduced, and the display effect of the first display region can be improved.

For example, in the embodiment of the present disclosure, among the plurality of traces, the length ratio of the longest trace to the shortest trace ranges from 8% to 20%. For example, among the plurality of traces, the length ratio of the longest trace to the shortest trace ranges from 10% to 15%.

For example, in the embodiment of the present disclosure, the distance between the seventh region 470 and the first display region 100 cannot be set too large because the parasitic capacitance of the traces in the first trace layer 310 is larger than that in other trace layers. For example, the number of columns of effective first pixel circuits 210 arranged between one column of the first pixel circuits 210 in the seventh region 470 closest to the first display region 100 and the first display region 100 is no more than 10 columns. For example, the number of columns of the effective first pixel circuits 210 arranged between one column of the first pixel circuits 210 in the seventh region 470 closest to the first display region 100 and the first display region 100 is no more than 5 columns. The above-mentioned "effective first pixel circuit" refers to a pixel circuit configured to be connected with the first light-emitting unit.

For example, as shown in FIGS. 17 to 23, some of the first light-emitting units 110 in the second region 420 are connected with the corresponding first pixel circuits 210 in the fourth region 440 through a plurality of fourth traces 3400 located in the first trace layer 310. The plurality of fourth traces 3400 located in the first trace layer 310 include a plurality of first sub-traces 3410 and a plurality of second sub-traces 3420. A portion extending along the first direction of the first sub-traces 3410 passes through the display region in the seventh region 470 to connect with the first pixel circuit 210 located in the fourth region 440, and the plurality of second sub-traces 3420 bypass the seventh region 470 to connect with the pixel circuits located in the fourth region 440.

For example, as shown in FIGS. 17 to 23, the display panel includes a central axis region C extending in the first direction and passing through the center of the first display region, the traces connected with the first light-emitting units in the fifth region 450 do not pass through the central axis region C, and the first sub-traces 3410 passing through the seventh region 470 include a portion passing through the central axis region C, and a portion interspersed among the plurality of third traces 300 (i.e., portions passing through a region where the third traces 300 are located). However, the second sub-trace 3420 is not interspersed among the plurality of third traces 3300, and is connected with the first pixel circuit 210 in the fourth region 440 after bypassing the upper edge (or lower edge) of the third traces 3300 by winding.

For example, an amount of the second sub-traces 3420 is greater than an amount of the first sub-traces 3410. For example, most of the fourth traces 3400 connected with the first light-emitting units in the second region 420 are routed above (or below) the trace region where the third trace 3300 is located, and a few traces are routed from the trace region where the third trace 3300 is located and the central axis region.

For example, an amount of the first sub-traces 3410 passing through a side of the central line extending in the first direction of the central axis region C may be six. For example, an amount of the first sub-traces 3410 passing through both sides of the center line extending in the first direction of the center axis region C may all be six.

Compared with the display panel shown in FIG. 15 and FIG. 16, in which the first conductive lines connected with the light-emitting elements in the farthest region from the first display region are connected with the corresponding pixel circuits by winding (instead of being inserted in the trace region). In this embodiment of the present disclosure, some of the fourth traces are inserted among the plurality of third traces, and even some of the fourth traces are arranged to pass through the central axis region, which can effectively reduce the length of some of the fourth traces to reduce the resistance of some of the fourth traces.

For example, as shown in FIGS. 17 to 23, because the traces 300 (fourth traces 3400) connected with some of the first light-emitting units 110 in the second region 420 and the traces 300 (third traces 3300) connected with the first light-emitting units 110 in the fifth region 450 are both located in the first trace layer 310, and the fourth region 430 is located on a side of the seventh region 470 away from the first display region 100, the second region 420 is located on the side of the fifth region 450 away from the second region 200. In order to realize the connection between the fourth trace 3400 and the first pixel circuit 210 of the fourth region 440, it is necessary to set one region between the fourth region 440 and the seventh region 470 to realize the winding of some of the fourth trace 3400.

For example, as shown in FIGS. 17 to 23, an eighth region 480 is arranged between the fourth region 440 and the seventh region 470, and the plurality of second sub-traces 3420 bypass the edge of the seventh region 470 and are connected with the first pixel circuits 210 located in the fourth region 440 through the eighth region 480.

Figure 24:
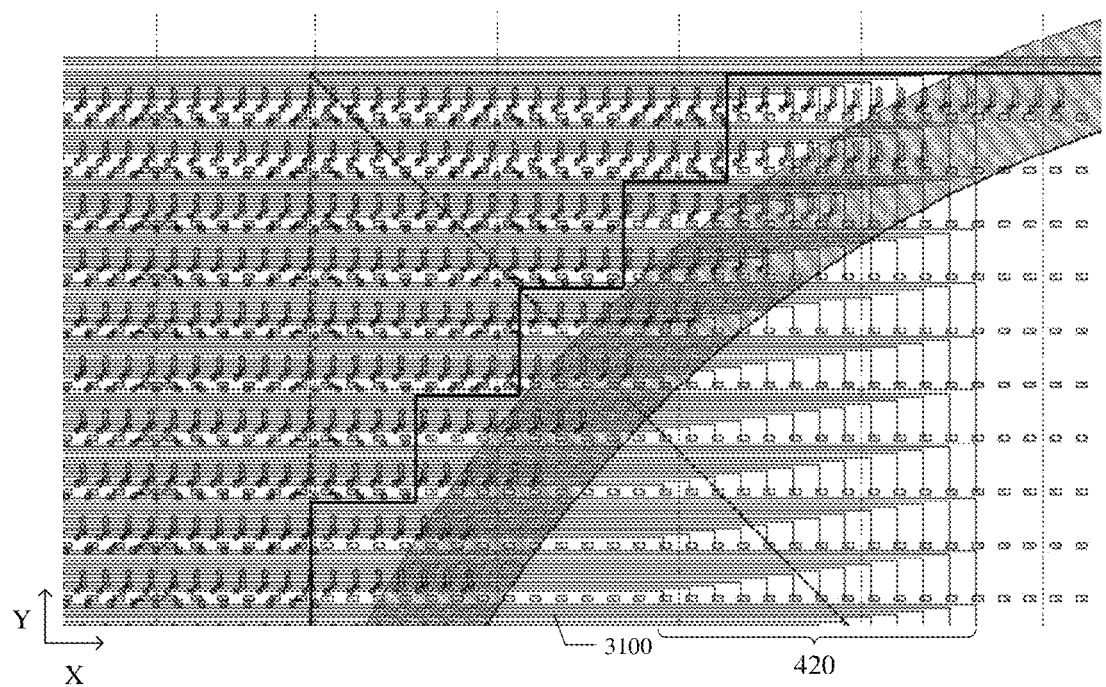
FIG. 24 is a schematic plan view of a first conductive layer and a second trace layer at a junction position of the first display region and the second display region on the display panel.
Figure 25:
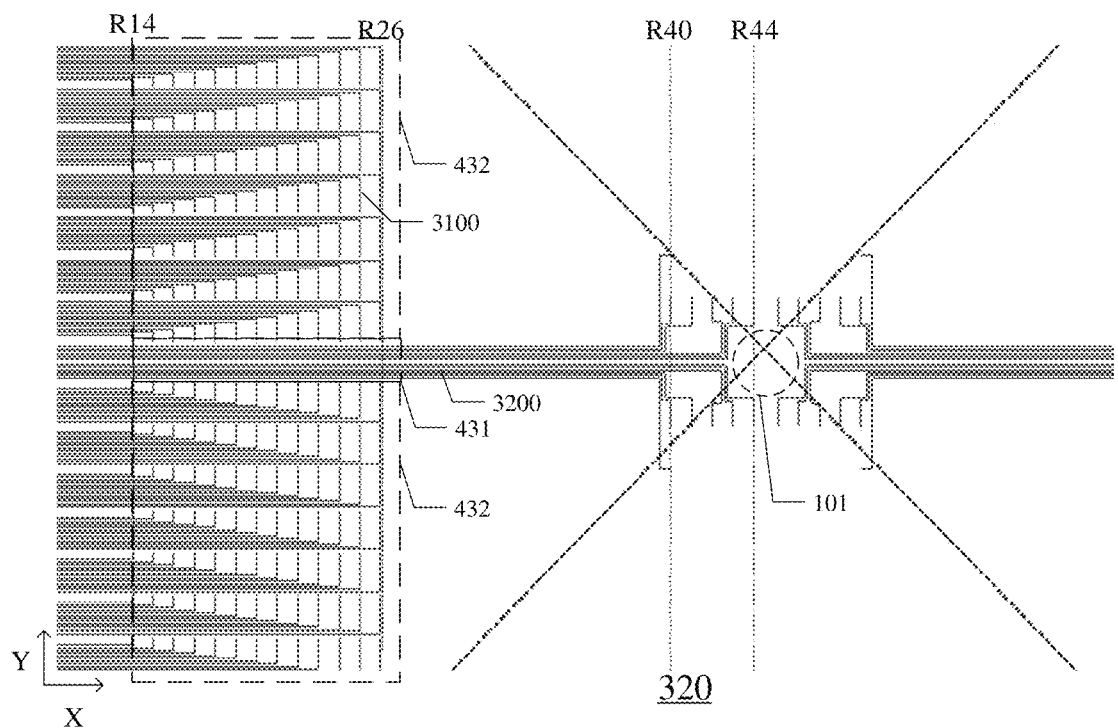
FIG. 25 is a schematic plan view of a second trace layer at a junction position of the first display region and the second display region on the display panel.
Figure 26:
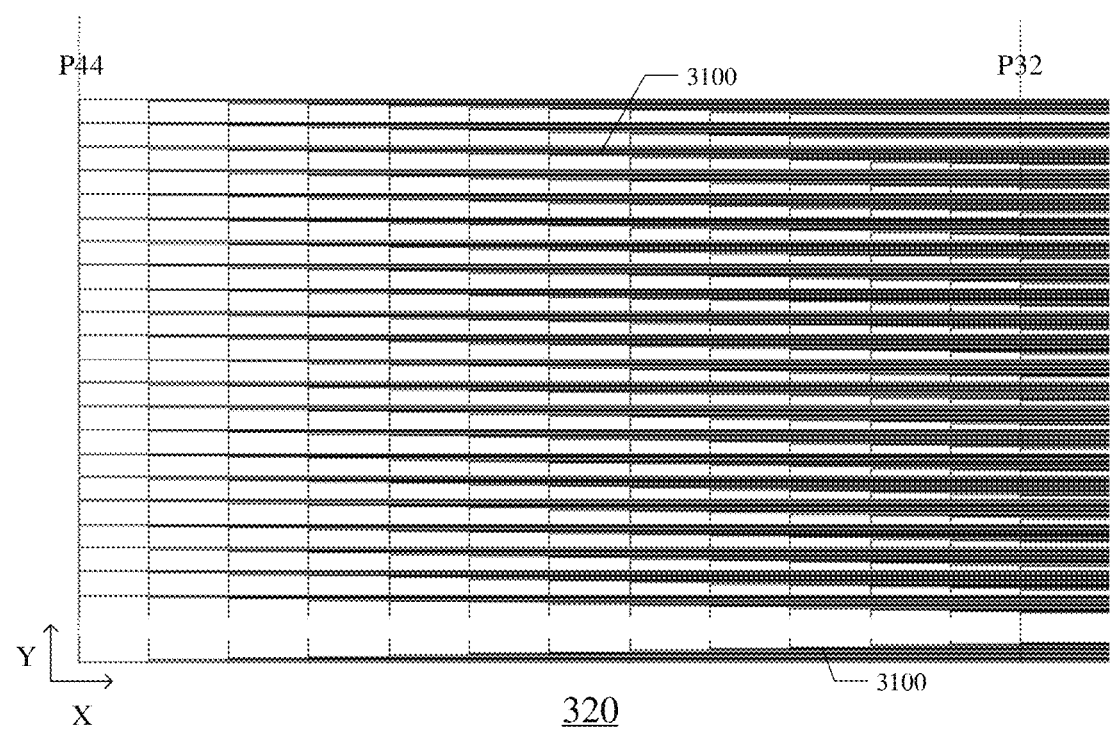
FIG. 26 is a schematic plan view of a second trace layer in a third region.
Figure 27:
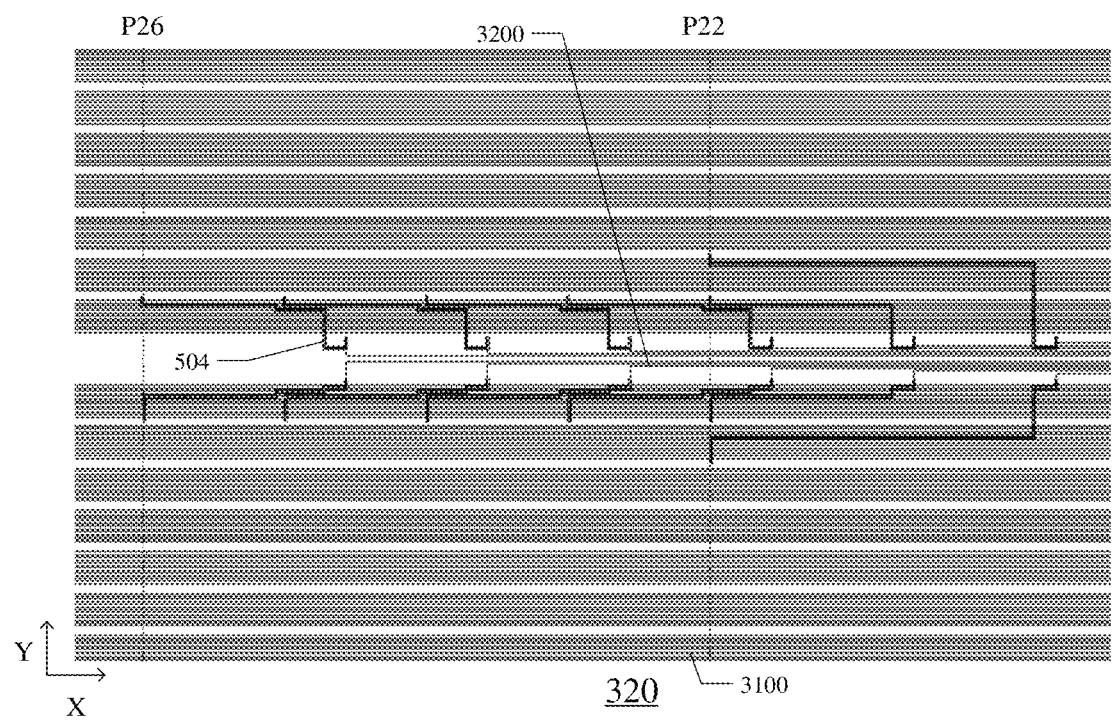
FIG. 27 is a schematic plan view of a second trace layer in a fourth region.

FIG. 24 is a schematic plan view of a first conductive layer and a second trace layer at a junction position of the first display region and the second display region on the display panel; FIG. 25 is a schematic plan view of a second trace layer at a junction position of the first display region and the second display region on the display panel; FIG. 26 is a schematic plan view of the second trace layer in the third region; and FIG. 27 is a schematic plan view of the second trace layer in the fourth region. As shown in FIGS. 17 to 18 and 24 to 27, the first light-emitting units 110 in the first region 410 are connected with the first pixel circuits 210 in the third region 430 through the plurality of first traces 3100 in the second trace layer 320, and some of the first light-emitting units 110 in the second region 420 are connected with the corresponding first light-emitting units in the fourth region 440 through the plurality of second traces 3200 in the second trace layer 320.

For example, as shown in FIGS. 17-18 and 24-27, the first region 410 includes a first central region 431 extending in the first direction and first edge regions 432 on both sides of the first central region 431 in the second direction, the first trace 3100 is located in the first edge region 432 and the second trace 3200 is located in the first central region 431. For example, the first central region 431 is a partial region of the central axis region shown in FIG. 23. For example, the second direction may be the Y direction, and the second direction intersects the first direction. The embodiment of the present disclosure is not limited thereto, and the first direction and the second direction can be interchanged.

For example, as shown in FIGS. 17-18 and 24-27, a part of traces (the second traces 3200) in the second trace layer 320 are arranged in a trace pattern extending in the first direction and arranged in the second direction, and another part of traces (the first traces 3100) in the second trace layer 320 passes through the central axis region.

Compared with the display panel shown in FIGS. 15 and 16, where the second conductive lines connected with the light-emitting elements in the farthest region from the first display region are connected with the corresponding pixel circuits by winding (instead of penetrating through the trace region), in the embodiment of the present disclosure, the second trace is set to pass through the central axis region, so that the length of the second trace can be reduced, the resistance and parasitic capacitance of the second trace can be reduced, and the display effect of the first display region can be improved.

For example, as shown in FIGS. 24 to 27, an amount of the second traces 3200 located on a side of the center line extending in the first direction of the first central region 431 may be six. For example, an amount of the second traces 3200 located on both sides of the center line extending in the first direction of the first central region 431 may be six.

For example, as shown in FIGS. 17 to 18 and 24 to 27, the first conductive layer 500 (located on a side of the first trace layer 310 facing the base substrate 01) further includes a transfer line 504, and the traces 300 connected with some of the first light-emitting units 110 in the second region 420 are connected with the corresponding first pixel circuits 210 through the transfer line 504. Because the fourth region is located on the side of the third region facing the first display region, the second region is located on the side of the first region away from the second display region, and the traces connecting the first light-emitting units in the first region are located on the second trace layer, and a part of the traces connecting the first light-emitting units in the second region are also located on the second trace layer, in order to prevent the two parts of traces located in the second trace layer (i.e., the first trace and the second trace) from crosstalk, at least part of the second traces needs to be connected with the first pixel circuit through the transfer line.

Figure 28:
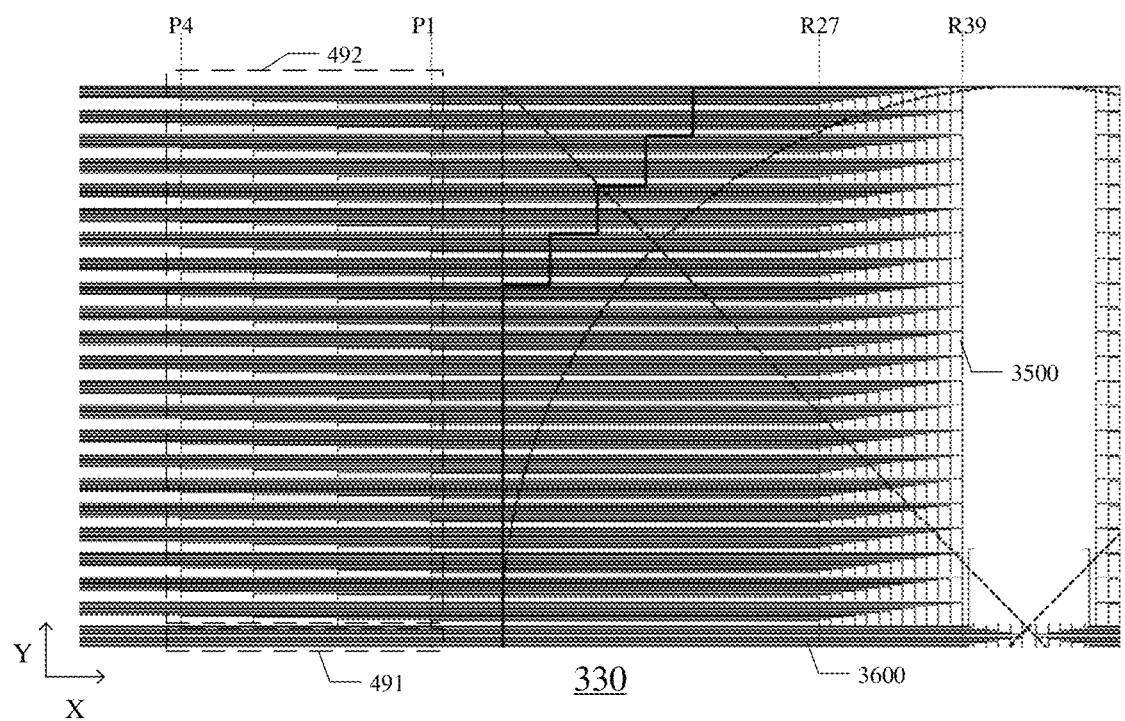
FIG. 28 is a schematic plan view of a third trace layer at a junction position of the first display region and the second display region on the display panel.
Figure 29:
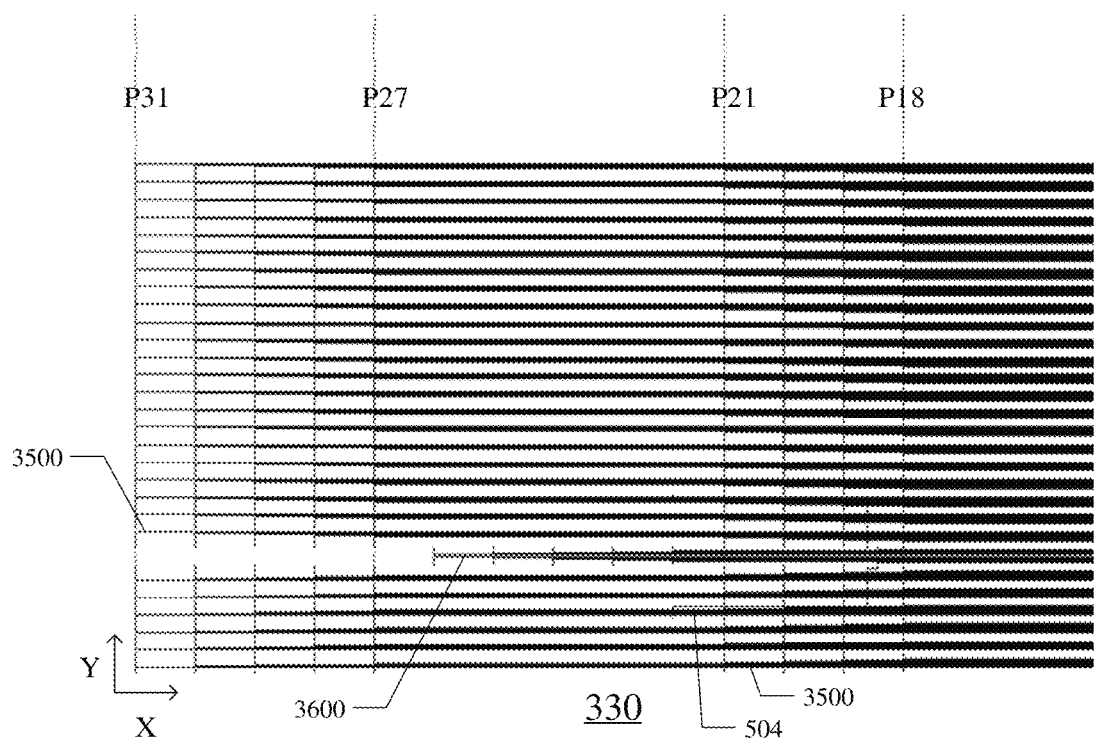
FIG. 29 is a schematic plan view of a third trace layer of an eighth region, a fourth region, a tenth region and a part of a seventh region.
Figure 30:
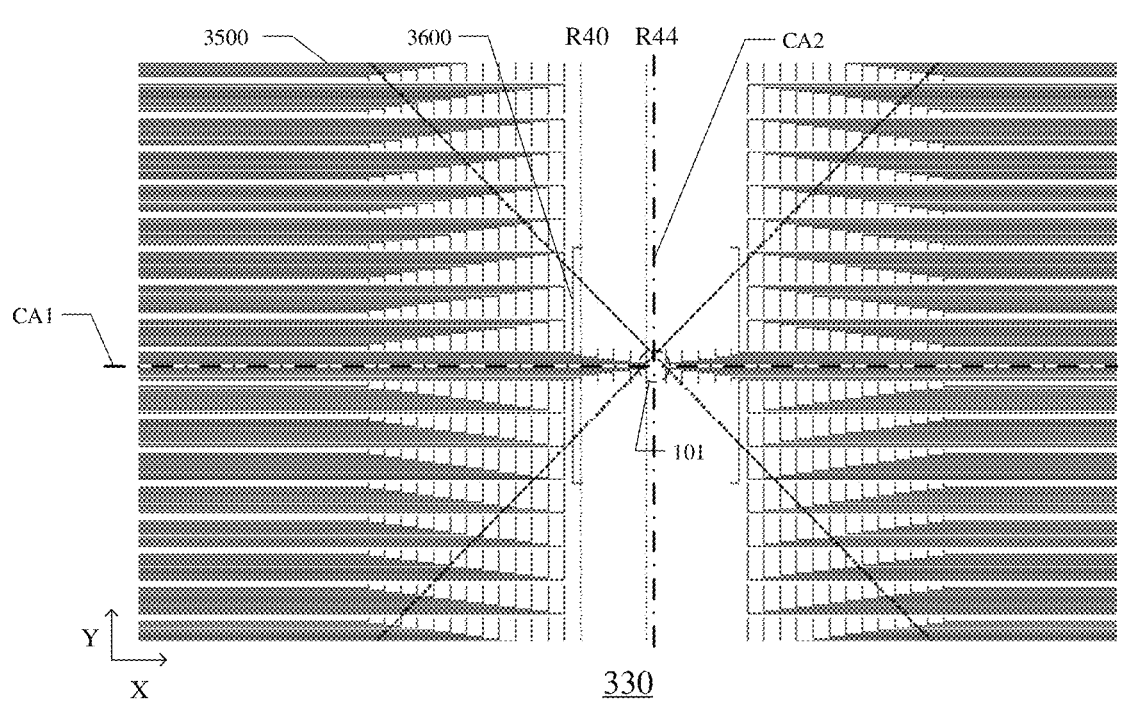
FIG. 30 is a schematic plan view of a third trace layer of a second region, a sixth region and a part of a first region.
Figure 31:
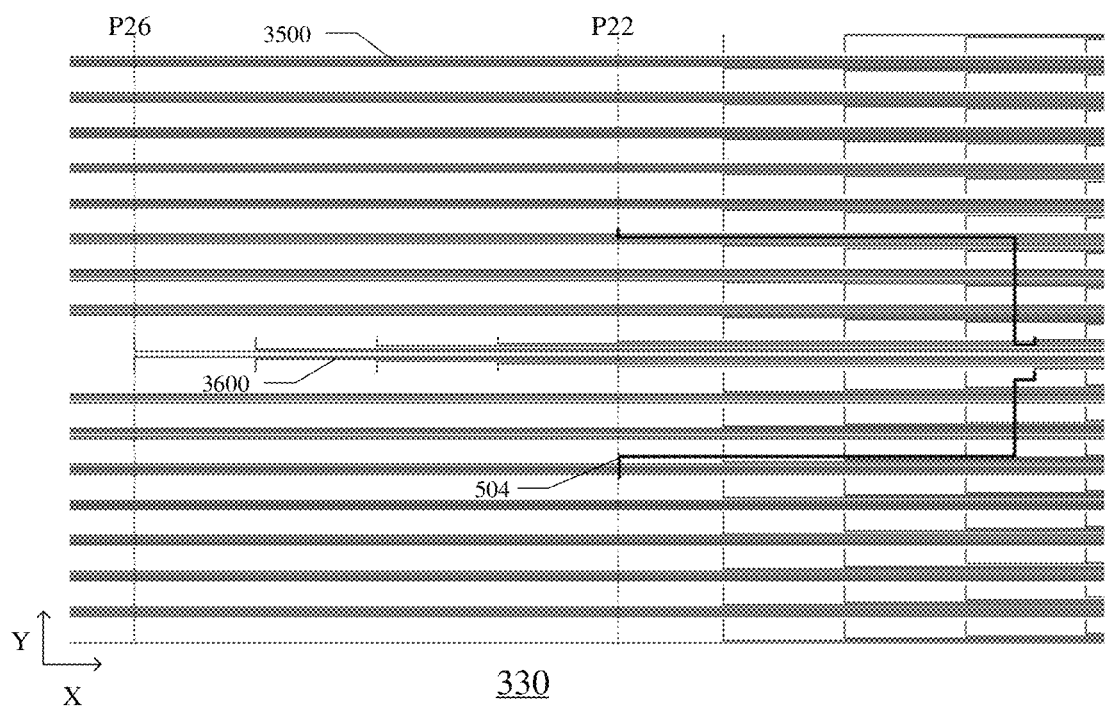
FIG. 31 is a schematic plan view of a third trace layer in a fourth region and a part of an eighth region.

For example, FIG. 28 is a schematic plan view of a third trace layer at a junction position of the first display region and the second display region on the display panel, FIG. 29 is a schematic plan view of a third trace layer of an eighth region, a fourth region, a tenth region and a part of a seventh region, FIG. 30 is a schematic plan view of a third trace layer of a second region, a sixth region and a part of a first region; and FIG. 31 is a schematic plan view of a third trace layer in a fourth region and a part of an eighth region. As shown in FIGS. 17 to 18 and 28 to 31, the first light-emitting units 110 in the sixth region 460 may be connected with the first pixel circuits 210 distributed in at least two nonadjacent regions. For example, the at least two nonadjacent regions may include a ninth region 490 and an eighth region 480 located on the side of the seventh region 470 facing the first display region 100.

For example, as shown in FIGS. 17-18 and 28-31, first light-emitting units of belong to a first part of the first light-emitting units 110 in the sixth region 460 are connected with the corresponding first pixel circuits 210 in the eighth region 480 through a plurality of fifth traces 3500 in the third trace layer 330, and some of the first light-emitting units 110 in the second region 420 are connected with the corresponding first pixel circuits 210 in the fourth region through a plurality of sixth traces 3600 in the third trace layer 330.

For example, as shown in FIGS. 17 to 18 and 28 to 31, first light-emitting units 110 belong to a second part of the first light-emitting units 110 of the sixth region 460 are connected with the corresponding first pixel circuits 210 in the ninth region 490 through the plurality of fifth traces 3500 in the third trace layer 330.

For example, as shown in FIGS. 17 to 18 and 28 to 31, the ninth region 490 includes a second central region 491 extending in the first direction and second edge regions 492 on both sides of the second central region 491 in the second direction. The fifth trace 3500 is located in the second edge region 492, and the sixth trace 3600 is located in the second central region 492. For example, the second central region 491 is a part of the central axis region shown in FIG. 23. For example, the second direction may be the Y direction, and the second direction intersects the first direction. The embodiment of the present disclosure is not limited thereto, and the first direction and the second direction can be interchanged.

For example, as shown in FIGS. 17-18 and 28-31, part of traces (the fifth trace 3500) in the third trace layer 330 are arranged in a trace pattern extending in the first direction and arranged in the second direction, and another part of traces (the sixth trace 3600) in the third trace layer 330 pass through the central axis region.

Compared with the display panel shown in FIGS. 15 and 16, the third conductive line connected with the light-emitting element in the farthest region from the first display region is connected with the corresponding pixel circuit by winding (instead of penetrating the trace region). In this embodiment of the present disclosure, the sixth trace is set to pass through the central axis region, which can reduce the length of the sixth trace, reduce the resistance and parasitic capacitance of the sixth trace, and it is beneficial to improve the display effect of the first display region.

For example, as shown in FIGS. 28 to 31, an amount of the sixth traces 3600 located on a side of the center line extending in the first direction of the second central region 491 may be six. For example, an amount of the sixth traces 3600 located on both sides of the center line extending in the first direction of the second central region 491 may be six.

For example, as shown in FIGS. 17 to 18 and 28 to 31, the second display region 200 further includes a tenth region 4100 located between the fourth region 440 and the third region 430, and first light-emitting units belong to a third part of the first light-emitting units 110 of the sixth region 460 are connected with the corresponding first pixel circuits 210 located in the tenth region 4100 through the plurality of fifth traces 3500 located in the third trace layer 330.

For example, the tenth region is located on a side of the fourth region away from the first display region, the sixth region is located on a side of the second region close to the second display region, and the trace connecting the first light-emitting unit in the tenth region is located on the third trace layer, and the traces connecting some of the first light-emitting units in the second region are located on the third trace layer. In order to prevent the crosstalk between these two parts of traces (i.e., the fifth traces and the sixth traces) in the third trace layer, at least part of the third trace needs to be connected with the first pixel circuit through the transfer line 504.

For example, as shown in FIGS. 17 to 31, at least one selected from the group consisting of the third region 430, the fourth region 440, the seventh region 470, the eighth region 480, the ninth region 490 and the tenth region 4100 has no more than 18 columns of the first pixel circuits 210 configured to be connected with the first light-emitting units 110. For example, an amount of columns of the first pixel circuits in the above region can be determined according to the distance between two adjacent rows of ITO transfer portions. For example, at least one selected from the group consisting of the third region 430, the fourth region 440, the seventh region 470, the eighth region 480, the ninth region 490, and the tenth region 4100 has no more than 13 columns of the first pixel circuits 210 configured to be connected with the first light-emitting units 110.

For example, as shown in FIGS. 17 to 31, the embodiment of the present disclosure schematically shows that the second display region 200 includes 44 columns of first pixel circuits, and the first display region 10 includes 44 columns of first light-emitting units, but is not limited thereto. The second display region 200 includes 48 columns of first pixel circuits, and the first display region 10 includes 48 columns of first light-emitting units.

For example, as shown in FIGS. 17 to 31, the ninth region 490 includes the first pixel circuits 210 in columns P1 to P4, the seventh region 470 includes the first pixel circuits 210 in columns P5 to P17, the eighth region 480 includes the first pixel circuits 210 in columns P18 to P21, the fourth region 440 includes the first pixel circuits 210 in columns P22 to P26, the tenth region 4100 includes the first pixel circuits 210 in columns P27 to P31, and the third region 430 includes the first pixel circuits 210 in columns P32 to P44.

For example, as shown in FIGS. 17 to 31, the fifth region 450 includes first light-emitting units 110 in columns R1 to R13, the first region 410 includes first light-emitting units 110 in columns R14 to R26, the sixth region 460 includes first light-emitting units 110 in columns R27 to R39, and the second region 420 includes first light-emitting units 110 in columns R40 to R44.

For example, as shown in FIGS. 17 to 30, the first display region includes a first central axis CA1 extending in the first direction and a second central axis CA2 perpendicular to the first central axis CA1, and the traces 300 connected with the first light-emitting units in at least one of the first region 410, the fifth region 450, and the sixth region 460 are symmetrically distributed with the first central axis CA1 as the central axis.

For example, the traces 300 connected with the first light-emitting units 110 in the first region 410, the fifth region 450 and the sixth region 460 are all distributed in an axisymmetric manner with the first central axis CA1 as the central axis, so that, for example, the space for arranging the second traces 3200 can be formed between the first traces 3100, which are located on both sides of the first central region 431 in the Y direction and are adjacent to the first central region 431, shown in FIG. 25, therefore, the second trace 3200 is prevented from winding from the peripheral regions of the first display region and the second display region, thereby being beneficial to reducing the length of the second trace. For example, as shown in FIG. 28, the space for arranging the sixth trace 3600 can be formed between the fifth traces 3500, which are located on both sides of the second central region 421 in the Y direction and are adjacent to the second central region 421, which prevents the sixth trace 3600 from winding from the peripheral regions of the first display region and the second display region, thus being beneficial to reducing the length of the sixth trace.

For example, the direction indicated by the arrow in the Y direction is upward, and the traces 300 located above the first central axis CA1, such as the traces 300 connected with the first light-emitting units in the first region 410, the fifth region 450 and the sixth region 460, are routed in an upward folding way; the traces 300 located below the first central axis CA1, for example, the traces 300 connected with the first light-emitting units in the first region 410, the fifth region 450 and the sixth region 460, are routed in a downward folding way, so that the traces 300 located above and below the first central axis CA1 are respectively folded in directions away from each other to form an axisymmetric distribution, and thus a space can be formed between the first central region 431 and the second central region 491.

For example, the plurality of traces 300 are symmetrically distributed with the first central axis CA1, and the plurality of traces 300 are symmetrically distributed with the second central axis CA2, which can facilitate the design of traces. For example, the traces 300 located in the first edge region 432 are symmetrically distributed with the first central axis CA1, and the traces 300 located in the first central region 431 are also symmetrically distributed with the first central axis CAL For example, the centerline of the first central region 431 extending in the X direction includes the first central axis CAL For example, as shown in FIG. 17 to FIG. 31, the first display region 100 includes a display center region 101 located in the center, and the plurality of traces 300 are distributed in a central symmetry about the display center region 101. For example, the symmetry center of the plurality of traces 300 may be located in the center of the display center region or may be offset from the center of the display center region. The above center symmetrical distribution can be set according to actual products. For example, the symmetrical centers of plurality of traces can be determined according to the placement position of the ITO transfer portions. If a horizontal line extending in the first direction through the center of the display center region does not coincide with a central line extending in the first direction of two adjacent rows of ITO transfer portions closest to the horizontal line, the symmetrical centers of plurality of traces will deviate from the center of the display center region, but the traces are basically symmetrical as a whole, that is, the display center region can be distributed as a center symmetrical distribution. Because the pixel circuits and the light-emitting units are not symmetrical, the position of connecting the light-emitting units or the pixel circuits will shift. For example, taking the center of the camera hole under the screen on the center axis of the scree as an example, the length of the trace connecting the first column of light-emitting elements, farthest from the center, in the left half of the first display region with the corresponding pixel circuit is L11, for example, 80 μm, however, the length of the trace connecting the first column of light-emitting elements, farthest from the center, in the right half of the first display region with the corresponding pixel circuits are L12, for example, 190 μm, and L11 and L12 are different. After connecting the light-emitting elements in the left and right halves of the first display region with the corresponding pixel circuits, the trace lengths on both sides of the trace will be different. For example, each trace in the left half of the first display region will be shorter than each trace in the right half of the second display region, which is mainly because the ITO transfer portions on both sides of the first display region are asymmetric from the central axis of the screen, it can be called that the pixel circuits and the light-emitting units are asymmetric. In the case where the traces are set to be centrosymmetric, although the lengths of the traces are different, the routing trend of the traces is the same. For example, in the case where the center position of the camera hole under the screen is limited to the central axis of the screen, but the positions of the first pixel circuits are not symmetrical about the central axis of the screen, which leads to lengths of left and right traces to be unequal. If the center position of the camera hole is adjusted, the symmetry of the first pixel circuits about the central axis of the hole can be improved to some extent.

In the display panel shown in FIG. 15 to FIG. 16, the conductive lines L1 are symmetrically distributed with respect to the center line of the second display region A2 extending in the Y direction, and the conductive lines L1 connected with the light-emitting elements in the region farthest from the first display region A1 bypass the upper part (or the lower part) of the first display region A1 to realize winding connection. In the embodiment of the present disclosure, the traces 300 are distributed roughly symmetrically with respect to the display center region of the first display region 100, so that part of the traces connected with the light-emitting units in the region farthest from the second display region can pass through the central axis region, and the lengths of the traces can be effectively reduced to reduce the resistance and parasitic capacitance of the traces, which is conducive to improving the display effect of the first display region.

Another embodiment of the present disclosure provides a display device including the display panel as mentioned above.

For example, the display device provided by the embodiment of the present disclosure may be an organic light-emitting diode display device.

For example, in the display device provided by the embodiment of the present disclosure, by setting the position of the first pixel circuit connected with the first light-emitting unit in the first display region, it is possible to minimize the length difference of the traces connecting the plurality of first light-emitting units and the plurality of first pixel circuits, reduce the resistance difference of traces with different lengths, and further improve the display quality of the second display region (the region where the camera under the screen is located).

For example, the display device may further include a cover on a display side of the display panel. For example, the display device may further include a functional component located on the side of the base substrate away from the light-emitting unit, and the functional component is opposite to the second display region.

For example, the functional components include at least one of a camera module (e.g., a front camera module), a 3D structured light module (e.g., a 3D structured light sensor), a time of flight 3D imaging module (e.g., a time of flight sensor), an infrared sensing module (e.g., an infrared sensor), etc.

For example, the front camera module is usually activated when the user takes a selfie or makes a video call, and the pixel display region of the display device displays the image obtained by the selfie for the user to watch. The front camera module includes a lens, an image sensor, an image processing chip, etc. The optical image generated by the lens of the scene is projected on the surface of the image sensor (the image sensor includes CCD and CMOS) and converted into an electrical signal, which is converted into a digital image signal by the image processing chip, and then sent to the processor for processing, and the image of the scene is output on the display screen.

For example, the 3D structured light sensor and the time of flight (ToF) sensor can be used for face recognition to unlock the display device.

For example, the functional component may only include a camera module to realize the function of selfie or video call; for example, the functional component may further include a 3D structured light module or a time of flight 3D imaging module to realize face recognition unlocking, etc. This embodiment includes but is not limited thereto.

For example, the display device can be any product or component with a display function, such as a mobile phone with an under-screen camera, a tablet computer, a notebook computer, a navigator, etc. This embodiment is not limited thereto.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In the case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A display panel, comprising:
    a base substrate, the display panel comprising a first display region and a second display region, wherein the second display region is on at least one side of the first display region in a first direction, the first display region comprises a plurality of first light-emitting units on the base substrate, and the second display region comprises a plurality of second light-emitting units, a plurality of first pixel circuits and a plurality of second pixel circuits on the base substrate, in the first direction, at least one of the plurality of first pixel circuits is between adjacent second pixel circuits, at least one of the plurality of first pixel circuits is connected with at least one of the plurality of first light-emitting units, and at least one of the plurality of second pixel circuits is connected with at least one of the plurality of second light-emitting units; and
    a plurality of traces, on the base substrate and configured to connect the first pixel circuits and corresponding first light-emitting units,
    wherein the first display region comprises a plurality of regions arranged along the first direction, the plurality of regions comprise a first region and a second region, the second display region comprises a third region and a fourth region arranged along the first direction, the first light-emitting unit in the first region is connected with the first pixel circuit in the third region, the first light-emitting unit in the second region is connected with the first pixel circuit in the fourth region, the fourth region is on a side of the third region close to the first display region, and the first region is on a side of the second region close to the second display region.

2. The display panel according to claim 1, wherein each of traces connected with some of first light-emitting units in one region, which is farthest from the second display region, among the plurality of regions in the first display region comprises a main portion and an edge portion which extend in the first direction, the main portion and the edge portion are on different straight lines, a length of the main portion is larger than a length of the edge portion, and the main portion passes through the second display region.

3. The display panel according to claim 1, wherein the plurality of traces comprise a plurality layers of traces distributed in different layers, and the plurality layers of traces sequentially comprise a first trace layer, a second trace layer and a third trace layer in a direction perpendicular to the base substrate, and the first trace layer is between the second trace layer and the base substrate;
    the plurality of regions further comprise a fifth region and a sixth region, wherein the fifth region is on a side of the first region close to the second display region, and the sixth region is between the first region and the second region, and the first light-emitting unit of the fifth region is connected with the first trace layer, the first light-emitting unit of the first region is connected with the second trace layer, and the first light-emitting unit of the sixth region is connected with the third trace layer, the first light-emitting unit of the second region is connected with at least one of the first trace layer, the second trace layer and the third trace layer, and the second region is one region farthest from the second display region among the plurality of regions.

4. The display panel according to claim 3, wherein a ratio of a length of a longest trace in the second trace layer connected with the first light-emitting unit in the first region to a length of a longest trace in traces connected with the first light-emitting unit in the second region ranges from 0.8 to 1.2.

5. The display panel according to claim 4, further comprising:
    a transfer line, on a side of the first trace layer facing the base substrate,
    wherein the traces connected with some of the first light-emitting units in the second region are connected with corresponding first pixel circuits through the transfer line.

6. The display panel according to claim 4, wherein the first light-emitting units in the first region are connected with the first pixel circuits in the third region through a plurality of first traces in the second trace layer, and some of the first light-emitting units in the second region are connected with corresponding first pixel circuits in the fourth region through a plurality of second traces in the second trace layer;
    the first region comprises a first central region extending in the first direction and first edge regions on both sides of the first central region in the second direction, the first traces are in the first edge region, the second traces are in the first central region, and the second direction intersects with the first direction.

7. The display panel according to claim 4, wherein the second display region further comprises a seventh region, the first light-emitting units in the fifth region are connected with the first pixel circuits in the seventh region through a plurality of third traces in the first trace layer, and the seventh region is on a side of the fourth region facing the first display region.

8. The display panel according to claim 7, wherein some of the first light-emitting units in the second region are connected with corresponding first pixel circuits in the fourth region through a plurality of fourth traces in the first trace layer;
    the plurality of fourth traces in the first trace layer comprise a plurality of first sub-traces and a plurality of second sub-traces, a portion, of each of the plurality of first sub-traces, extending in the first direction passes through the seventh region to connect with the first pixel circuit in the fourth region, and the plurality of second sub-traces bypass the seventh region to connect with the first pixel circuits in the fourth region.

9. The display panel according to claim 8, wherein an eighth region is between the fourth region and the seventh region, and the plurality of second sub-traces bypass an edge of the seventh region and pass through the eighth region to connect with the first pixel circuits in the fourth region.

10. The display panel according to claim 9, wherein first light-emitting units belong to a first part of the first light-emitting units in the sixth region are connected with corresponding first pixel circuits in the eighth region through a plurality of fifth traces in the third trace layer, and some of the first light-emitting units in the second region are connected with corresponding first pixel circuits in the fourth region through a plurality of sixth traces in the third trace layer.

11. The display panel according to claim 10, wherein the second display region further comprises a ninth region on a side of the seventh region facing the first display region, and first light-emitting units belong to a second part of the first light-emitting units of the sixth region are connected with corresponding first pixel circuits in the ninth region through the plurality of fifth traces in the third trace layer.

12. The display panel according to claim 10, wherein the second display region further comprises a tenth region between the fourth region and the third region, and first light-emitting units belong to a third part of the first light-emitting units of the sixth region are connected with corresponding first pixel circuits in the tenth region through the plurality of fifth traces in the third trace layer.

13. The display panel according to claim 11, wherein the ninth region comprises a second central region extending in the first direction and second edge regions on both sides of the second central region in the second direction, the plurality of fifth traces are in the second edge region, the plurality of sixth traces are in the second central region, and the second direction intersects with the first direction.

14. The display panel according to claim 1, wherein the plurality of traces comprise a transparent trace.

15. The display panel according to claim 1, wherein the plurality of second pixel circuits comprise a plurality of columns of second pixel circuits extending along a second direction intersecting the first direction and arranged along the first direction, and the plurality of first pixel circuits comprise a plurality of columns of first pixel circuits extending along the second direction and arranged along the first direction; and at least one column of first pixel circuits is between two adjacent columns of second pixel circuits.

16. The display panel according to claim 12, wherein an amount of columns of first pixel circuits configured to be connected with first light-emitting units provided in at least one selected from the group consisting of the third region, the fourth region, the seventh region, the eighth region, the ninth region and the tenth region is no more than 18 columns.

17. The display panel according to claim 3, wherein the first display region comprises a first central axis extending in the first direction and a second central axis perpendicular to the first central axis, and traces connected with first light-emitting units in at least one selected from the group consisting of the first region, the fifth region and the sixth region are distributed symmetrically with the first central axis as a central axis and are distributed symmetrically with the second central axis as a central axis.

18. The display panel according to claim 17, wherein the plurality of traces are symmetrically distributed with the first central axis as a central axis, and the plurality of traces are symmetrically distributed with the second central axis as a central axis.

19. A display device, comprising the display panel according to claim 1.

* * * * *